(12) United States Patent
Yonemura

(10) Patent No.: US 8,998,386 B2
(45) Date of Patent: Apr. 7, 2015

(54) LIQUID EJECTING APPARATUS

(75) Inventor: Takayuki Yonemura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 311 days.

(21) Appl. No.: 12/914,210

(22) Filed: Oct. 28, 2010

(65) Prior Publication Data
US 2011/0102514 A1     May 5, 2011

(30) Foreign Application Priority Data

Nov. 2, 2009   (JP) .................................. 2009-251740
May 20, 2010   (JP) .................................. 2010-116080

(51) Int. Cl.
    *B41J 2/045*     (2006.01)
    *B41J 2/14*     (2006.01)
    *B41J 2/055*     (2006.01)
    *H01L 41/04*     (2006.01)
    *H01L 41/09*     (2006.01)
    (Continued)

(52) U.S. Cl.
CPC .......... *B41J 2/14233* (2013.01); *B41J 2/04581* (2013.01); *B41J 2/04588* (2013.01); *B41J 2/0459* (2013.01); *B41J 2/055* (2013.01); *H01L 41/042* (2013.01); *H01L 41/0973* (2013.01); *H01L 41/1878* (2013.01); *H01L 41/318* (2013.01); *B41J 2002/14241* (2013.01); *B41J 2002/14419* (2013.01); *B41J 2202/03* (2013.01)
USPC .......................................................... 347/68

(58) Field of Classification Search
None
See application file for complete search history.

(56) References Cited

U.S. PATENT DOCUMENTS 5,729,262 A *   3/1998   Akiyama et al. ................ 347/70
7,786,656 B2     8/2010   Sakashita et al.
(Continued)

FOREIGN PATENT DOCUMENTS

EP     1986245     10/2008
GB     2338031     12/1999
(Continued)

OTHER PUBLICATIONS

Zhang et al, Preparation, structures, and multiferroic properties of single phase Bi1—xLaxFeO3 x=0-0.40) ceramics, Apr. 19, 2006, Journal of Applied Plysics 100, 114108.*

(Continued)

*Primary Examiner* — Matthew Luu
*Assistant Examiner* — Erica Lin
(74) *Attorney, Agent, or Firm* — Workman Nydegger

(57) ABSTRACT

Provided is a liquid ejecting apparatus which comprises a pressure generation chamber, a piezoelectric element, and a driving unit which supplies a driving signal to the piezoelectric element. The piezoelectric layer shows electric field induced phase transition and when among voltages at which the piezoelectric layer shows the electric field induced phase transition a voltage having a higher absolute value is defined as $V_F$ and a voltage having a lower absolute value is defined as $V_{AF}$, the driving unit supplies to the piezoelectric element a driving signal which allows the voltage to be applied to the piezoelectric layer, allows the voltage that passes through $V_F$ and of which the absolute value is equal to or higher than $V_{AF}$ to be set as a start point, and allows the voltage to be changed within a range where the absolute value is equal to or higher than $V_{AF}$.

6 Claims, 30 Drawing Sheets

(51) Int. Cl.
*H01L 41/187* (2006.01)
*H01L 41/318* (2013.01)

(56) References Cited

U.S. PATENT DOCUMENTS

| | | |
|---|---|---|
| 2005/0018019 A1 | 1/2005 | Miyazawa et al. |
| 2006/0131627 A1 | 6/2006 | Kondo et al. |
| 2008/0239016 A1 | 10/2008 | Miura |
| 2008/0265718 A1 | 10/2008 | Sakashita et al. |
| 2008/0297005 A1 | 12/2008 | Sakashita et al. |
| 2009/0267998 A1 | 10/2009 | Sakashita et al. |

FOREIGN PATENT DOCUMENTS

| | | |
|---|---|---|
| JP | 7-117228 | 5/1995 |
| JP | 08-17245 | 1/1996 |
| JP | 10-052071 | 2/1998 |
| JP | 2000-127392 | 5/2000 |
| JP | 2001-223404 | 8/2001 |
| JP | 2001-335362 | 12/2001 |
| JP | 2005-039166 | 2/2005 |
| JP | 2006-176366 | 7/2006 |
| JP | 2007-116091 | 5/2007 |
| JP | 2007-194429 | 8/2007 |
| JP | 2007-287739 | 11/2007 |
| JP | 2008-218547 | 9/2008 |
| JP | 2008-265289 | 11/2008 |
| JP | 2008-133634 | 12/2008 |
| JP | 2008-306164 | 12/2008 |
| JP | 4266036 | 2/2009 |
| JP | 2009-231482 | 10/2009 |
| JP | 2009231482 A * | 10/2009 |
| JP | 2009-287066 | 12/2009 |

OTHER PUBLICATIONS

Singh et al, Room temperature ferroelectric properties of Mn-substituted BiFeO2 thin films deposited on Pt electrodes using chemical solution deposition, Jun. 30, 2006, Journal of Applied Physics 88, 262908.*

S. K. Singh et al "Room temperature ferroelectric properties of Mn-substituted BiFeO3 thin films deposited on Pt electrodes using chemical solution deposition" Applied Physics Letters 88, 262908 (2006).

S. Fujino, et al "Combinatorial discovery of a lead-free morphotropic phase boundary in a thin-film piezoelectric perovskite" Applied Physics Letters 92, 202904 (2008).

A. Z. Simoes, et al "Piezoelectric behavior of SrRuO3 buffered lanthanum modified bismuth ferrite thin films grown by chemical method" Applied Physics Letters 93, 142902 (2008).

* cited by examiner

LIQUID EJECTING APPARATUS

CROSS-REFERENCE TO RELATED APPLICATIONS

This application claims the benefit of priority to Japanese Patent Application No. 2009-251740 filed Nov. 2, 2009, and Japanese Patent Application No. 2010-116080 filed May 20, 2010, the contents of which are hereby incorporated by reference in their entirety.

BACKGROUND

1. Technical Field

The present invention relates to a liquid ejecting apparatus including a piezoelectric element which includes a first electrode, a piezoelectric layer, and a second electrode and changes a pressure in a pressure generation chamber which communicates with a nozzle orifice.

2. Related Art

As a representative example of a liquid ejecting head mounted on a liquid ejecting apparatus, there has been disclosed an ink jet type recording head where, for example, a portion of a pressure generation chamber communicating with a nozzle orifice ejecting ink droplets is configured as a vibration plate, and by deforming the vibration plate with a piezoelectric element, the ink in the pressure ejecting chamber is pressed to eject the ink droplets from the nozzle orifice. As a piezoelectric element mounted on such an ink jet type recording head, there has been disclosed a piezoelectric element which is configured by interposing a piezoelectric layer made of a piezoelectric material having an electro-mechanical conversion function, for example, a crystallized dielectric material between two electrodes, for example, wherein a piezoelectric material layer is uniformly formed on the entire surface of the vibration plate by using a film formation technology, and the piezoelectric material layer is cut out in a shape corresponding to the pressure generation chamber by using a lithography method, so that the independent piezoelectric element is formed in each pressure generation chamber.

High piezoelectric characteristic (strain amount) is required by the piezoelectric material used for such a piezoelectric element. As a representative example of the piezoelectric material, there is a lead zirconate titanate (PZT) (refer to JP-A-2001-223404).

However, since the aforementioned lead zirconate titanate contains Pb, it may cause environmental problems. Therefore, a piezoelectric material in which a contained amount of Pb is suppressed has been required. In addition, as a piezoelectric material in which no Pb is contained, there are various materials such as $BiFeO_3$ having a perovskite structure expressed by $ABO_3$. However, in comparison with the lead zirconate titanate, such a material has a problem in that the strain amount is small.

Therefore, instead of the ferroelectric material such as PZT, an anti-ferroelectric material of which the strain amount is increased due to the electric field induced phase transition is considered for use. However, since the anti-ferroelectric material may not be driven at a voltage equal to or lower than a predetermined voltage and the strain amount thereof may has no linearity with respect to the voltage, a small amplitude vibration is difficult to generate. Since the behavior of the piezoelectric element using anti-ferroelectric material is different from that of the piezoelectric element using the ferroelectric material, there is a problem in that a desired amplitude is difficult to generate in an ink jet type recording apparatus in the related art.

SUMMARY

An advantage of some aspects of the invention is to provide a liquid ejecting apparatus having a piezoelectric element using a piezoelectric material showing electric field induced phase transition capable of driving with a desired amplitude.

According to a first aspect of the invention, there is provided a liquid ejecting apparatus including: a pressure generation chamber which communicates with a nozzle orifice which ejects liquid; a piezoelectric element which includes a first electrode, a piezoelectric layer formed on the first electrode, and a second electrode formed on the piezoelectric layer; a driving unit which supplies a driving signal to the piezoelectric element to change a pressure of an inner portion of the pressure generation chamber, so that liquid droplets are ejected from the nozzle orifice, wherein the piezoelectric layer shows electric field induced phase transition, and wherein, when among voltages at which the piezoelectric layer shows the electric field induced phase transition a voltage having a higher absolute value is defined as $V_F$ and a voltage having a lower absolute value is defined as $V_{AF}$, the driving unit supplies to the piezoelectric element a driving signal which allows the voltage to be applied to the piezoelectric layer, allows the voltage that passes through $V_F$ and of which the absolute value is equal to or higher than $V_{AF}$ to be set as a start point, and allows the voltage to be changed within a range where the absolute value is equal to or higher than $V_{AF}$ so as to change the pressure of the inner portion of the pressure generation chamber, so that the liquid droplets are allowed to be ejected from the nozzle orifice.

In the above aspect, since the piezoelectric element is driven with the ferroelectric phase region of the piezoelectric material showing the electric field induced phase transition, where the strain amount represents a linearity with respect to a change in voltage, it is possible to generate small amplitude vibration.

According to a second aspect of the invention, there is provided a liquid ejecting apparatus including: a pressure generation chamber which communicates with a nozzle orifice which ejects liquid; a piezoelectric element which includes a first electrode, a piezoelectric layer formed on the first electrode, and a second electrode formed on the piezoelectric layer; and a driving unit which supplies a driving signal to the piezoelectric element to change a pressure of an inner portion of the pressure generation chamber, so that liquid droplets are ejected from the nozzle orifice, wherein the piezoelectric layer shows electric field induced phase transition, and wherein, when among voltages at which the piezoelectric layer shows the electric field induced phase transition a voltage having a higher absolute value is defined as $V_F$ and a voltage having a lower absolute value is defined as $V_{AF}$, the driving unit supplies to the piezoelectric element a driving signal which allows the voltage to be applied to the piezoelectric layer, allows the voltage which passes through $V_F$ and of which the absolute value is higher than $V_{AF}$ to be set as a start point, and allows the voltage to be changed up to a voltage of which the absolute value is lower than $V_{AF}$ or a driving signal which allows the voltage to be applied to the piezoelectric layer, allows the voltage which does not pass through $V_F$ and of which the absolute value is lower than $V_F$ to be set as a start point, and allows the voltage to be changed up to a voltage of which the absolute value is higher than $V_{AF}$ so as to change the pressure of the inner portion of the pressure generation chamber, so that the liquid droplets are allowed to be ejected from the nozzle orifice.

In the above aspect, since the piezoelectric element is driven with the region showing the electric field induced phase transition of the piezoelectric material showing the electric field induced phase transition, it is possible to generate large amplitude vibration.

According to a third aspect of the invention, there is provided a liquid ejecting apparatus including: a pressure generation chamber which communicates with a nozzle orifice which ejects liquid; a piezoelectric element which includes a first electrode, a piezoelectric layer formed on the first electrode, and a second electrode formed on the piezoelectric layer; a driving unit which supplies a driving signal to the piezoelectric element to change a pressure of an inner portion of the pressure generation chamber, so that liquid droplets are ejected from the nozzle orifice, wherein the piezoelectric layer shows electric field induced phase transition, and wherein, when among voltages at which the piezoelectric layer shows the electric field induced phase transition a voltage having a higher absolute value is defined as $V_F$ and a voltage having a lower absolute value is defined as $V_{AF}$, the driving unit supplies to the piezoelectric element a driving signal which allows the voltage to be applied to the piezoelectric layer, allows the voltage which passes through $V_F$ and of which the absolute value is equal to or higher than $V_{AF}$ to be set as a start point, and allows the voltage to be changed within a range where the absolute value is equal to or higher than $V_{AF}$ and a driving signal which allows the voltage to be applied to the piezoelectric layer, allows the voltage which passes through $V_F$ and of which the absolute value is higher than $V_{AF}$ to be set as a start point and allows the voltage to be changed down to a voltage of which the absolute value is lower than $V_{AF}$ so as to change the pressure of the inner portion of the pressure generation chamber, so that the liquid droplets are allowed to be ejected from the nozzle orifice.

In the above aspect, since the piezoelectric element is driven with both regions, that is, the ferroelectric phase region where the strain amount represents a linearity with respect to the voltage and the anti-ferroelectric phase region showing the electric field induced phase transition, it is possible to generate small amplitude vibration and large amplitude vibration with the same piezoelectric element.

In addition, it is preferable that the liquid ejecting apparatus further includes a driving signal control unit which selectively supplies to the piezoelectric element a driving voltage which allows the voltage to be applied to the piezoelectric layer, allows the voltage which passes through $V_F$ and of which the absolute value is equal to or higher than $V_{AF}$ to be set as a start point, and allows the voltage to be changed within a range where the absolute value is equal to or higher than $V_{AF}$ and a driving voltage which allows the voltage to be applied to the piezoelectric layer, allows the voltage which passes through $V_F$ and of which the absolute value is higher than $V_{AF}$ to be set as a start point, and allows the voltage to be changed down to a voltage of which the absolute value is lower than $V_{AF}$. Accordingly, since the driving signal control unit, which selectively supplies the driving signal for small amplitude vibration and the driving signal for large amplitude vibration to the piezoelectric element is included, it is possible to generate a desired amplitude.

In the liquid ejecting apparatus, it is preferable that the piezoelectric material is a perovskite-type composite oxide containing Bi, La, Fe, and Mn and shows electric field induced phase transition. Particularly, it is preferable that the piezoelectric material is made of a composite oxide expressed by the following general formula (1). Accordingly, since the lead content is suppressed, it is possible to reduce the impact on the environment, and it is possible to implement a liquid ejecting apparatus including a piezoelectric element having a large strain amount.

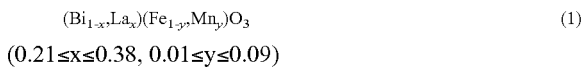

$$(Bi_{1-x},La_x)(Fe_{1-y},Mn_y)O_3 \quad (1)$$

$(0.21 \leq x \leq 0.38, 0.01 \leq y \leq 0.09)$

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
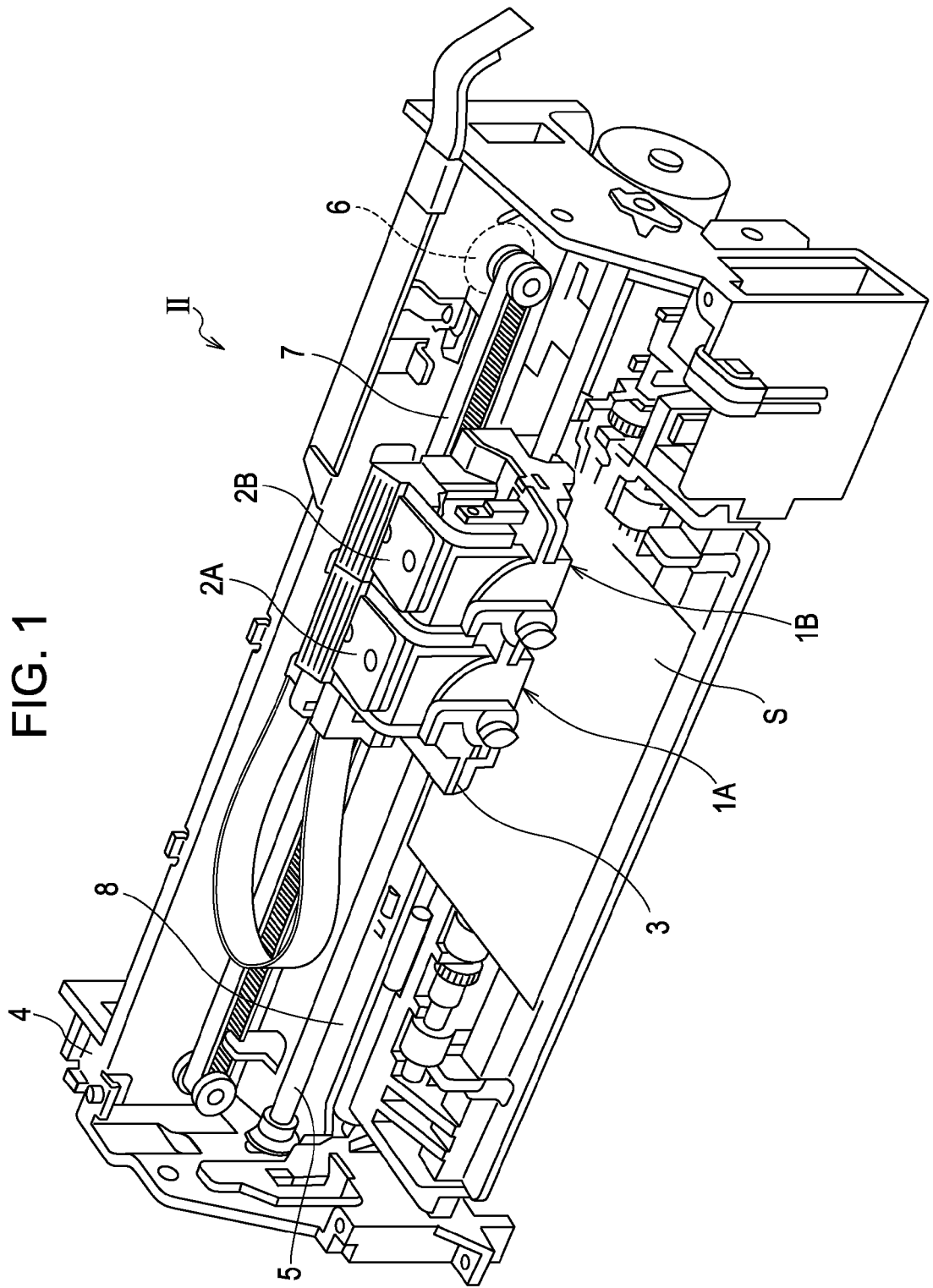
FIG. 1 is a schematic diagram illustrating a configuration of a recording apparatus according to a first embodiment of the invention.

FIG. 1 is a schematic diagram illustrating an ink jet type recording apparatus as an example of a liquid ejecting apparatus according to the invention. As illustrated in FIG. 1, in the ink jet type recording apparatus II, recording head units 1A and 1B having ink jet type recording heads I are detachably provided with cartridges 2A and 2B constituting an ink supplying unit, and a carriage 3 on which the recording head units 1A and 1B are mounted are disposed movably in the shaft direction to a cartridge shaft 5 mounted on an apparatus main body 4. The recording head units 1A and 1B are configured to eject, for example, a black ink composition and a color ink composition.

In addition, a driving force of a driving motor 6 is configured to be transmitted through a plurality of gears (not shown) and a timing belt 7 to the carriage 3, so that the carriage 3 on which the recording head units 1A and 1B are mounted is moved along the cartridge shaft 5. On the other hand, the apparatus main body 4 is provided with a platen 8 along the cartridge shaft 5, so that a recording sheet S, which is a recording medium such as a sheet fed by a feed roller (not shown) or the like, is allowed to wind around the platen 8 and to be transported.

Figure 2:
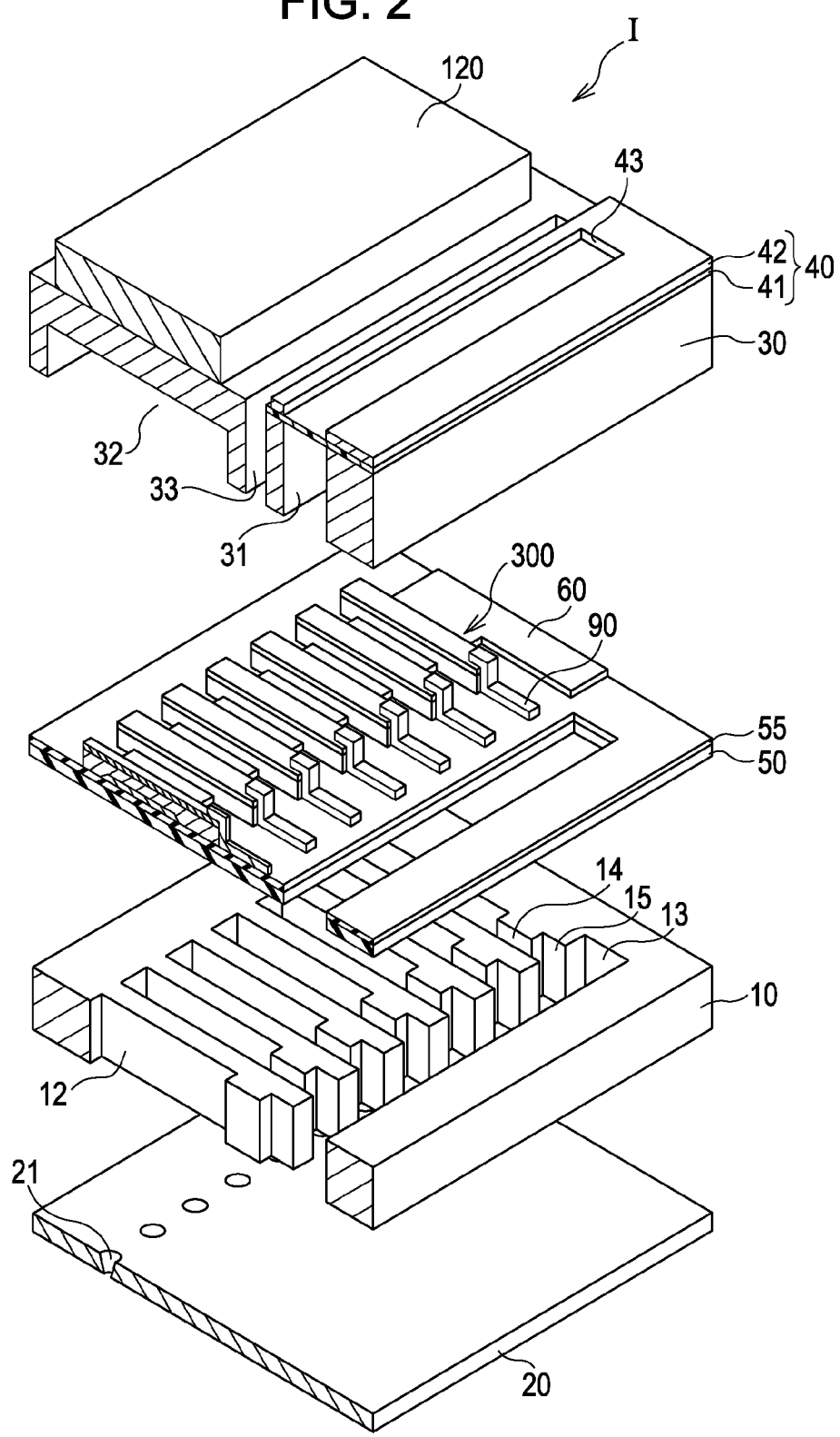
FIG. 2 is a schematic exploded diagram illustrating a configuration of a recording head according to the first embodiment of the invention.
Figure 3A:
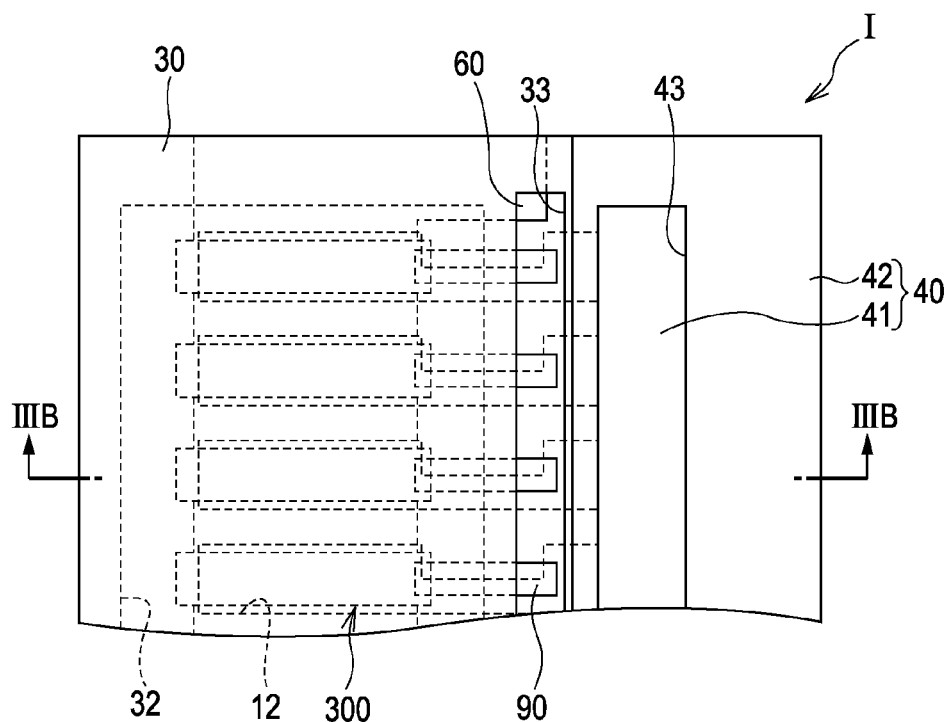
FIGS. 3A and 3B are a plan view and a cross-sectional view of the recording head according to the first embodiment of the invention.

Now, an ink jet type recording head mounted on such an ink jet type recording apparatus II is described with reference to FIG. 2 and FIGS. 3A and 3B. FIG. 2 is a schematic exploded diagram illustrating a configuration of an ink jet type recording head as an example of a liquid ejecting head according to a first embodiment of the invention. FIG. 3A is a plan view of FIG. 2, and FIG. 3B is a cross-sectional view taken along line IIIB-IIIB' of FIG. 3A.

Figure 3B:
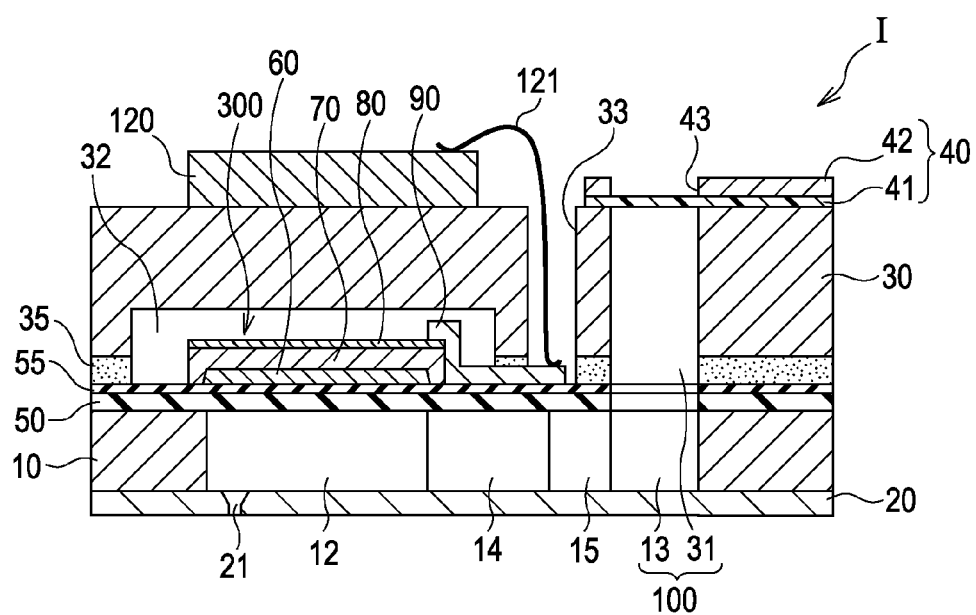

As illustrated in FIG. 2 and FIGS. 3A and 3B, a passage-forming substrate 10 according to the embodiment is constructed with a single-crystalline silicon substrate, and an elastic film 50 made of silicon dioxide is formed on the one surface thereof.

A plurality of pressure generation chambers 12 are disposed in parallel on the passage-forming substrate 10 in the width direction. In addition, a communicating portion 13 is formed in an area of a longitudinal direction outer side of the pressure generation chambers 12 of the passage-forming substrate 10, so that the communicating portion 13 and each of the pressure generation chambers 12 communicate with each other through an ink supplying path 14 and a communicating path 15 which are provided to each of the pressure generation chambers 12. The communicating portion 13 communicates with a reservoir portion 31 of the later-described protective substrate so as to constitute a portion of a reservoir which becomes a common ink chamber of the pressure generation chambers 12. The ink supplying path 14 is formed with a width narrower than the pressure generation chamber 12, so that a liquid passage resistance of the ink which is flown from the communicating portion 13 into the pressure generation chamber 12 is maintained to be constant. In addition, in the embodiment, although the ink supplying path 14 is formed by narrowing the width of the liquid passage at the one side thereof, the ink supplying path may be formed by narrowing the width of the liquid passage at the two sides thereof. In addition, instead of narrowing the width of the liquid passage, the ink supplying path may be formed by narrowing in the thickness direction. In the embodiment, a liquid flow passage including the pressure generation chambers 12, the communicating portion 13, the ink supplying paths 14, and the communicating paths 15 is disposed on the passage-forming substrate 10.

In addition, a nozzle plate 20 where nozzle orifices 21 are punctured so as to communicate with the vicinities of the end portions opposite to the ink supplying paths 14 of the pressure generation chambers 12 is fixed on an opening surface side of the passage-forming substrate 10 by an adhesive, a thermal welding film, or the like. In addition, the nozzle plate 20 is made of, for example, a glass ceramic, a single-crystalline silicon substrate, a stainless steel, or the like.

On the other hand, as described above, the elastic film 50 is formed on the side opposite to the opening surface of the passage-forming substrate 10, and an insulating layer 55 made of zirconium oxide is formed on the elastic film 50.

In addition, an piezoelectric element 300 is configured by laminating a first electrode 60, a piezoelectric layer 70 which is a thin film having a thickness of 2 μm or less, preferably, 0.3 to 1.5 μm, and a second electrode 80 on the insulating layer 55. In addition, in order to improve adhesiveness between the piezoelectric element 300 and the insulating layer 55, a layer made of titanium oxide may be provided between the insulating layer 55 and the piezoelectric element 300. Herein, the piezoelectric element 300 denotes a portion including the first electrode 60, the piezoelectric layer 70, and the second electrode 80. In general, the one electrode of the piezoelectric element 300 is formed as a common electrode, and the other electrode thereof and the piezoelectric layer 70 are patterned for each of the pressure generation chambers 12. In the embodiment, although the first electrode 60 is formed as a common electrode of the piezoelectric elements 300, and the second electrode 80 is formed as an individual electrode of each of the piezoelectric elements 300, a reverse configuration may be employed according to configurations of a driving circuit or wiring lines. In addition, herein, the piezoelectric element 300 and the vibration plate of which the displacement is generated by the driving of the piezoelectric element 300 are collectively referred to as an actuator device. In addition, in the aforementioned example, the elastic film 50, the insulating layer 55, and the first electrode 60 function as a vibration plate. The present invention is not limited thereto. For example, the elastic film 50 and the insulating layer 55 are not provided, but only the first electrode 60 may function as a vibration plate. In addition, the piezoelectric element 300 may also actually function as a vibration plate.

In addition, in the embodiment, the piezoelectric layer 70 is a piezoelectric material showing the electric field induced phase transition such as a perovskite-type composite oxide which contains Bi, La, Fe, and Mn and shows the electric field induced phase transition. More specifically, the piezoelectric layer 70 is an $ABO_3$ type composite oxide expressed by, for example, the following general formula (1). In addition, as illustrated in the later-described Examples, the $ABO_3$ type composite oxide expressed by the following general formula (1) shows the electric field induced phase transition. In addition, as illustrated in the later-described Examples and Comparative Examples, the $ABO_3$ type composite oxide containing Bi, La, Fe, and Mn may become a ferroelectric material or an anti-ferroelectric material according to a composition ratio thereof.

$(0.21 \leq x \leq 0.38, 0.01 \leq y \leq 0.09)$

In addition, in the $ABO_3$ type structure, that is, in the perovskite structure, oxygen is located with 12 coordinates at the A site, and oxygen is located with 6 coordinates at the B site, so that octahedron is formed. In addition, Bi and La are located at the A site, and Fe and Mn are located at the B site.

Herein, the electric field induced phase transition is phase transition caused by an electric field and denotes phase transition from an anti-ferroelectric phase to a ferroelectric phase or phase transition from a ferroelectric phase to an anti-ferroelectric phase. In addition, the ferroelectric phase is a state that polarization axes are aligned in the same direction, and the anti-ferroelectric phase is a state that polarization axes are alternately aligned. For example, in the phase transition from the anti-ferroelectric phase to the ferroelectric phase, the polarization axes in the anti-ferroelectric phase, which are alternately aligned, are rotated by 180 degrees, so that the polarization axes are in the same direction. Accordingly, the ferroelectric phase is generated. Due to the electric field induced phase transition, lattices are expanded or contracted, so that strain is generated. This strain is the electric field induced phase transition strain generated by the electric field induced phase transition.

Figure 4:
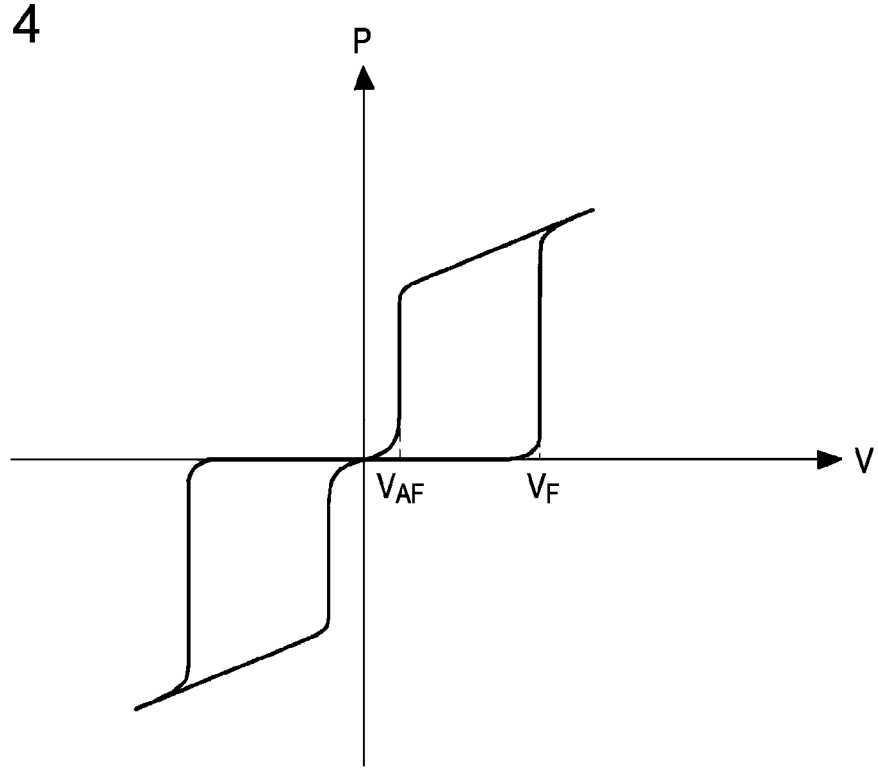
FIG. 4 is a diagram illustrating a P-V curve of an anti-ferroelectric material.
Figure 5:
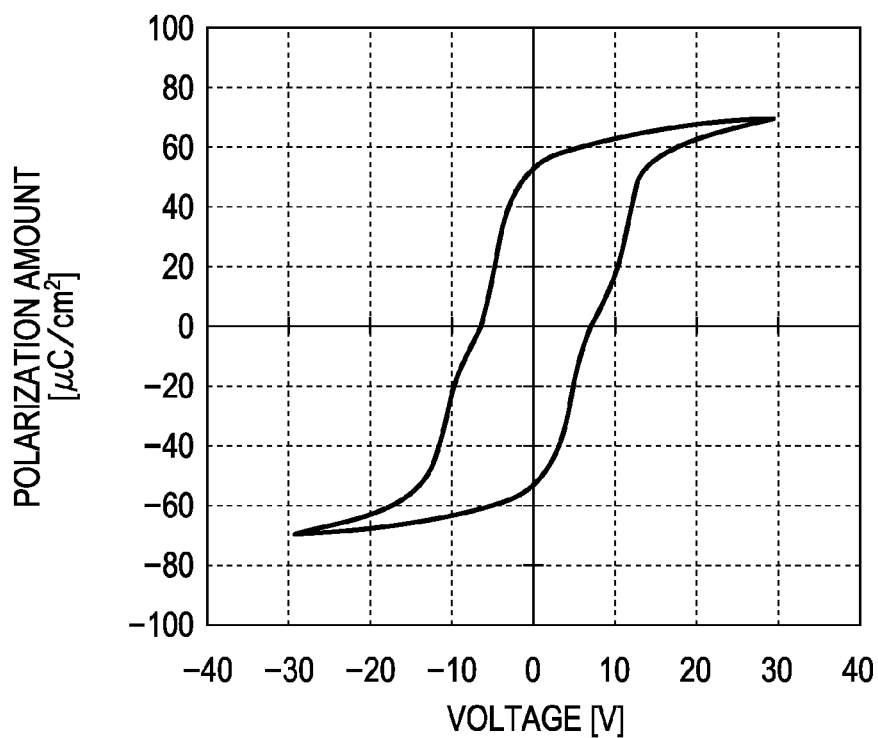
FIG. 5 is a diagram illustrating a P-V curve of Example 1.
Figure 6:
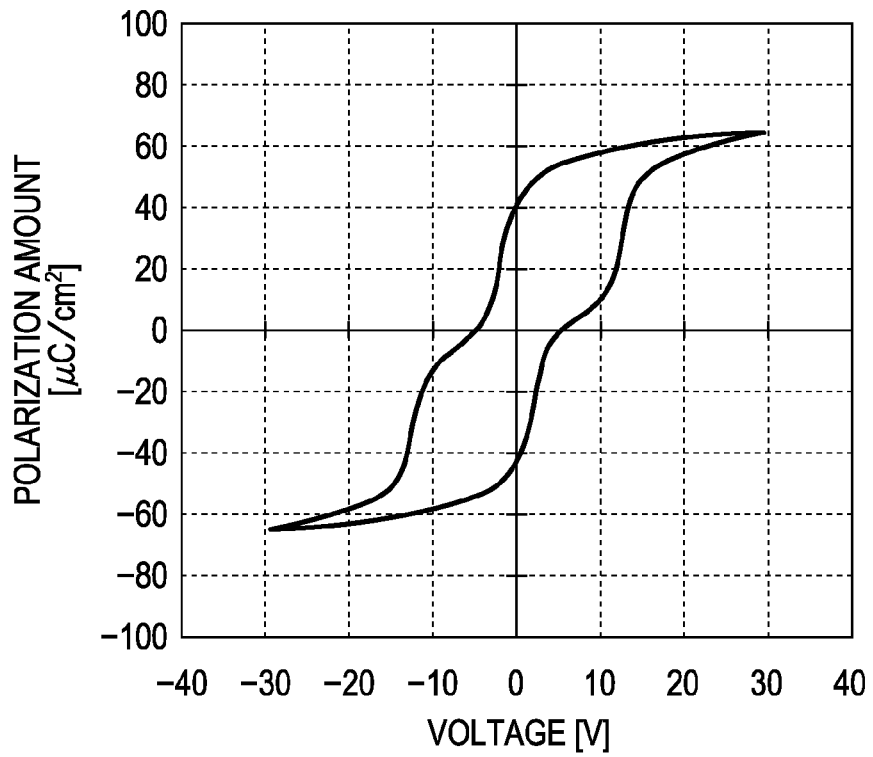
FIG. 6 is a diagram illustrating a P-V curve of Example 2.
Figure 7:
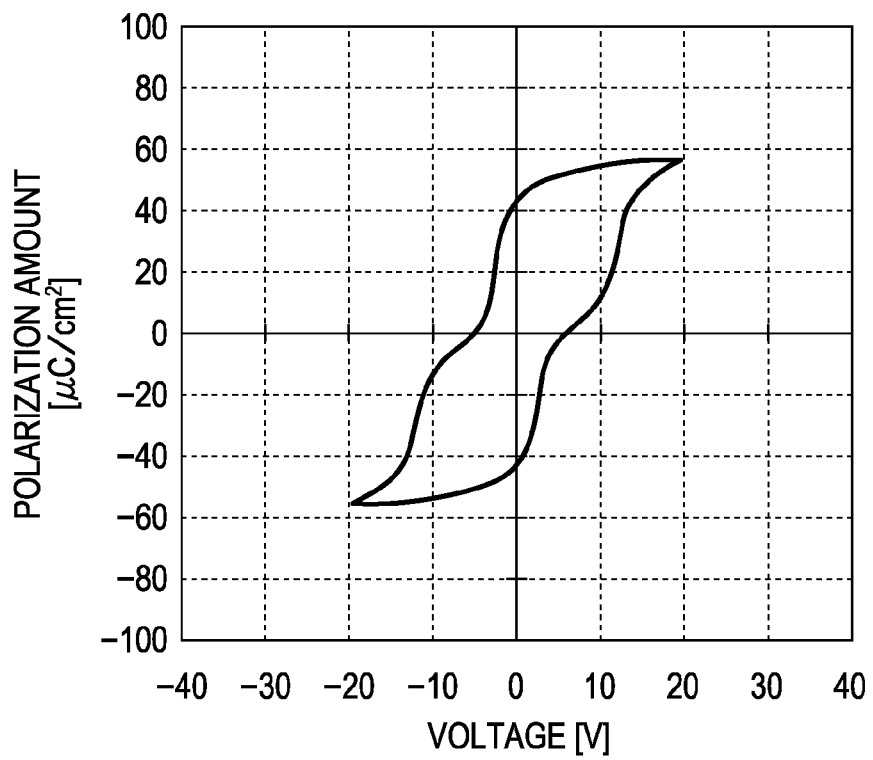
FIG. 7 is a diagram illustrating a P-V curve of Example 3.
Figure 8:
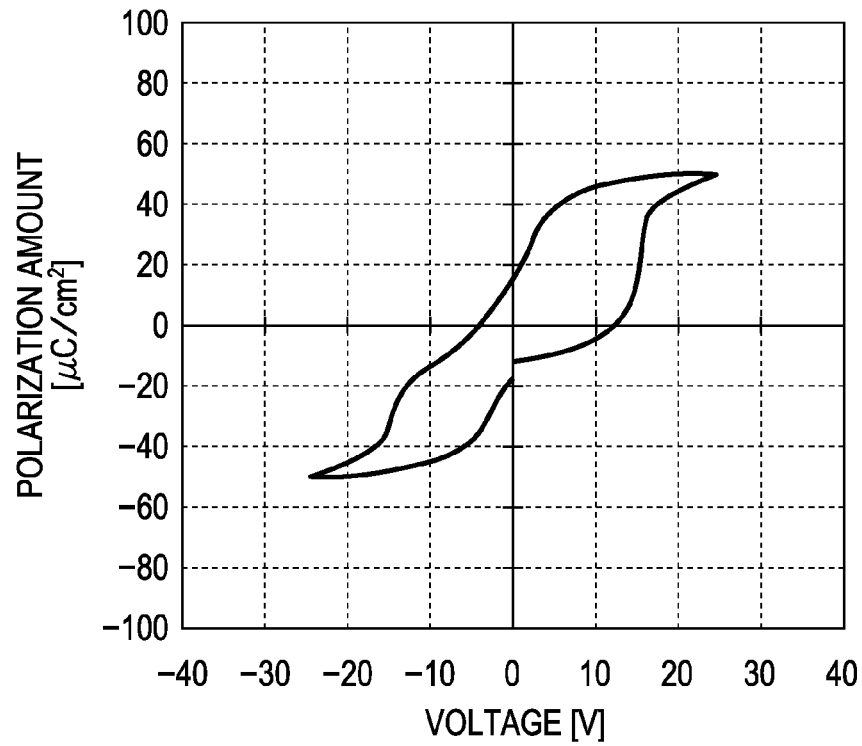
FIG. 8 is a diagram illustrating a P-V curve of Example 4.
Figure 9:
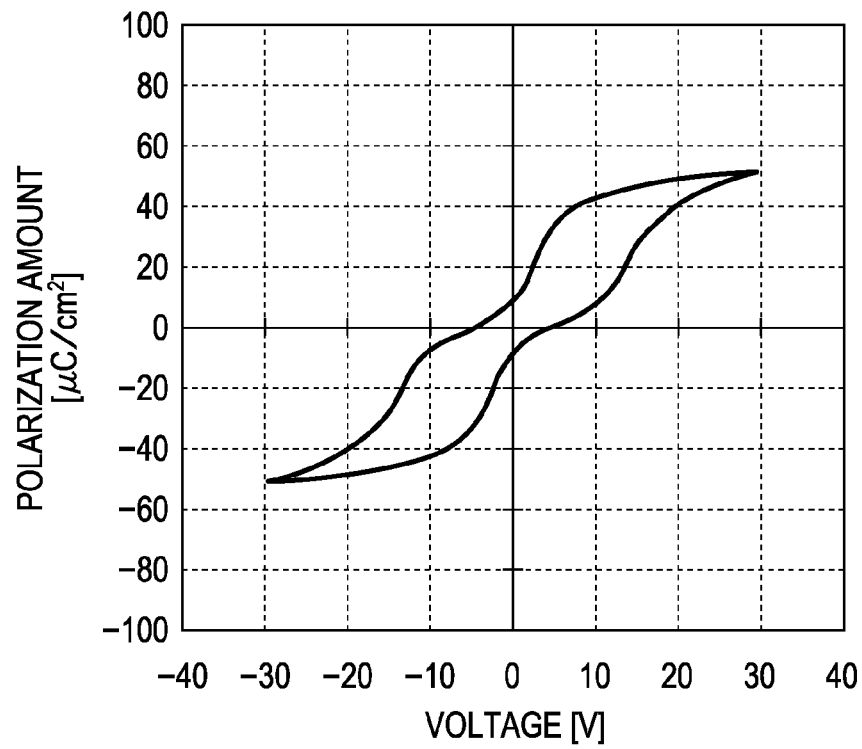
FIG. 9 is a diagram illustrating a P-V curve of Example 5.
Figure 10:
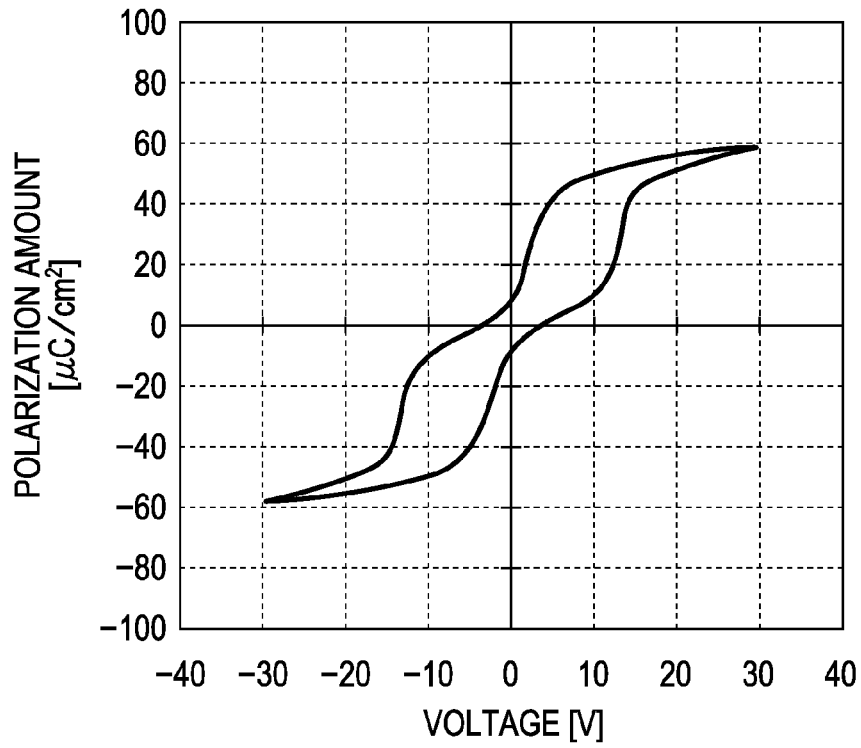
FIG. 10 is a diagram illustrating a P-V curve of Example 6.
Figure 11:
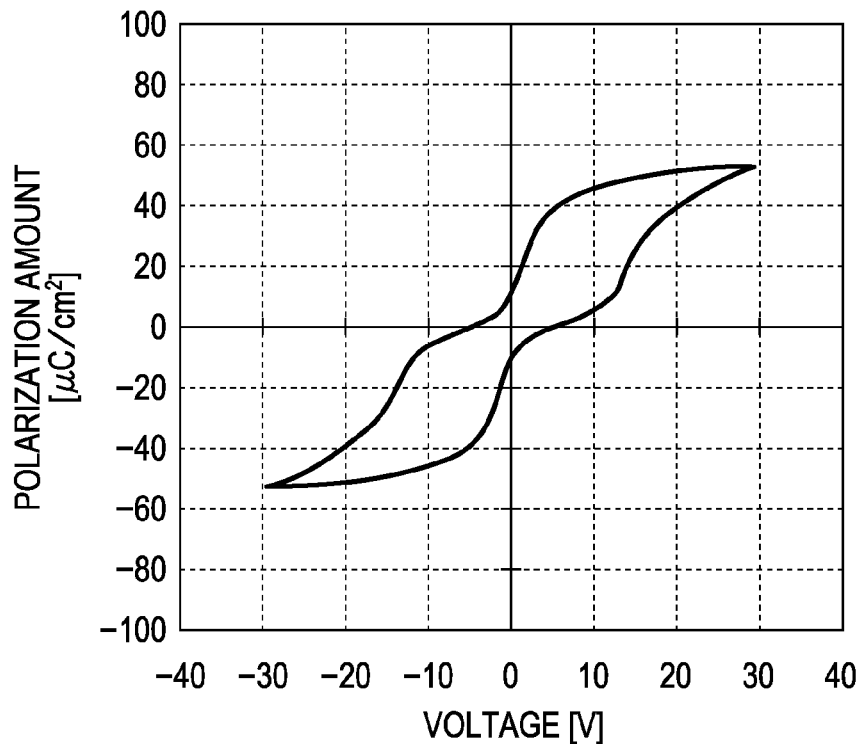
FIG. 11 is a diagram illustrating a P-V curve of Example 7.
Figure 12:
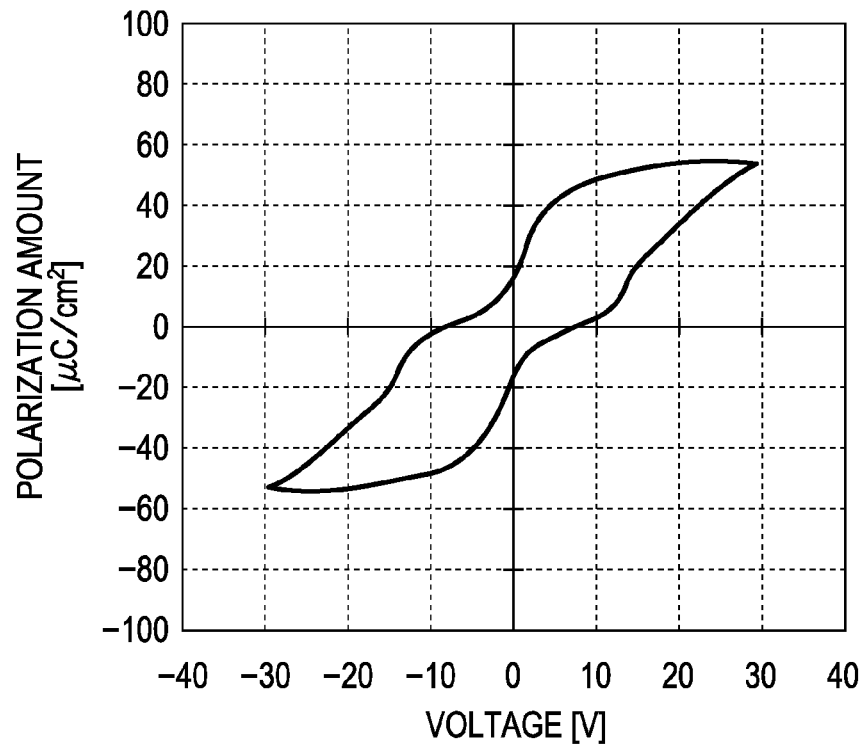
FIG. 12 is a diagram illustrating a P-V curve of Example 8.
Figure 13:
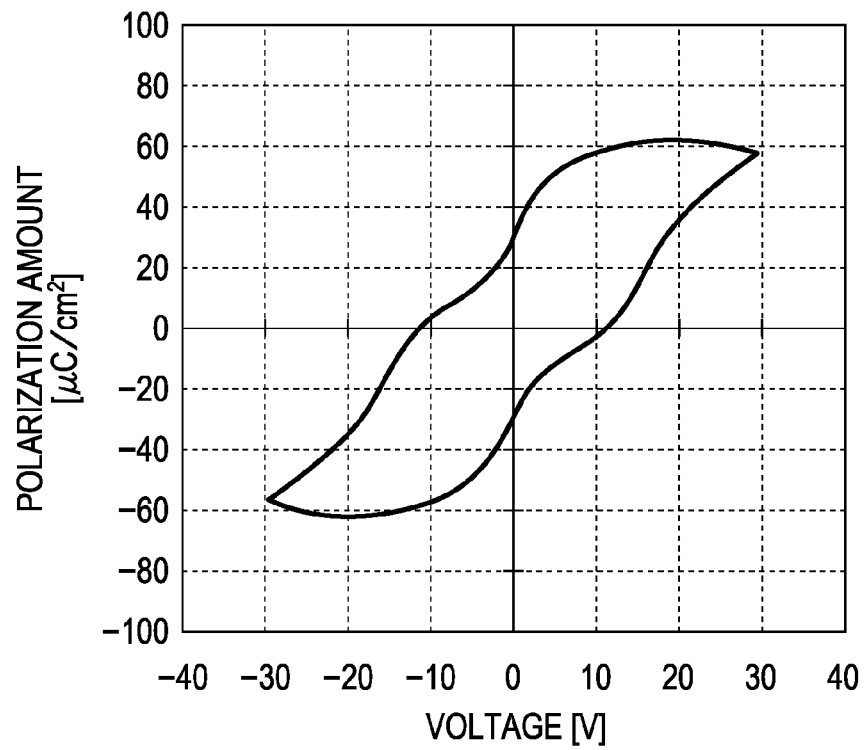
FIG. 13 is a diagram illustrating a P-V curve of Example 9.
Figure 14:
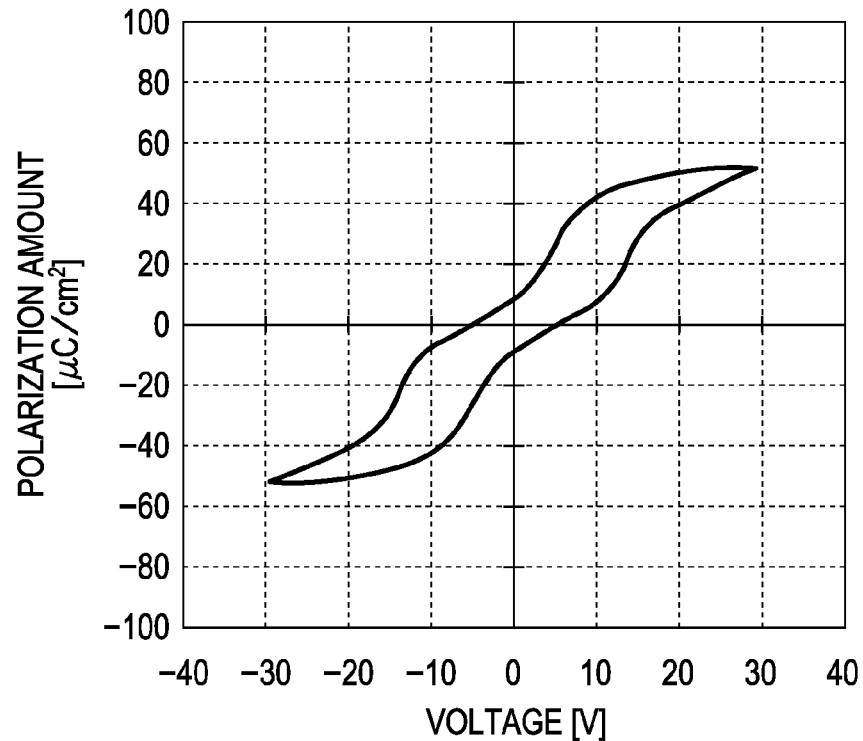
FIG. 14 is a diagram illustrating a P-V curve of Example 10.
Figure 15:
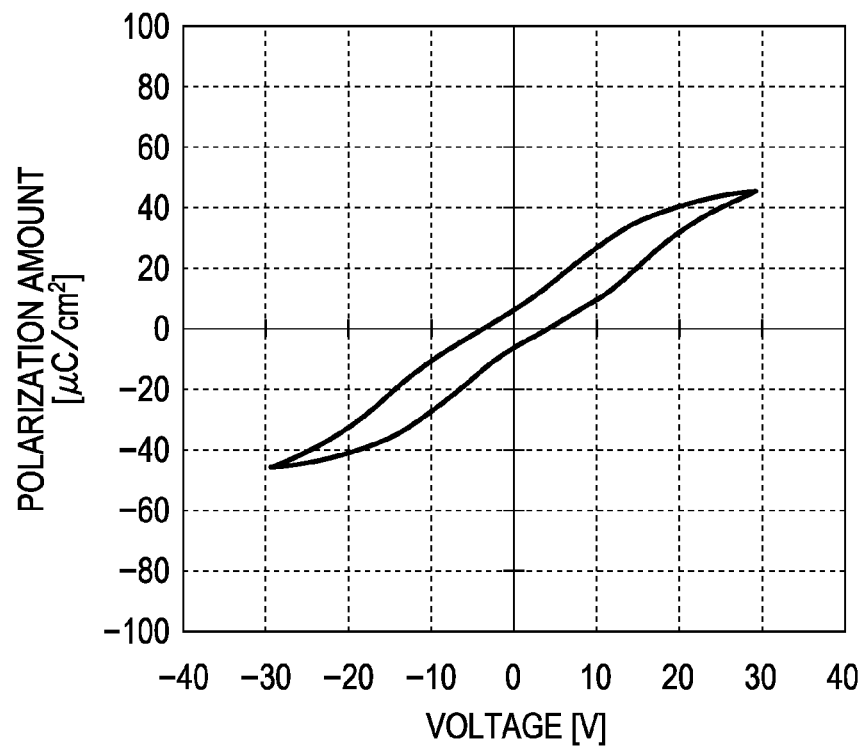
FIG. 15 is a diagram illustrating a P-V curve of Example 11.
Figure 16:
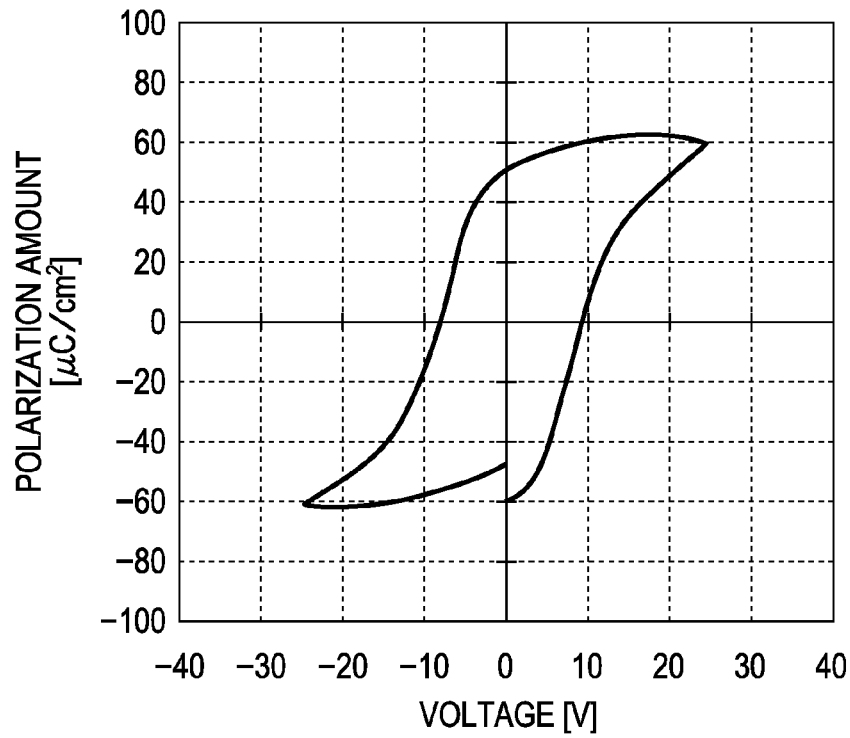
FIG. 16 is a diagram illustrating a P-V curve of Comparative Example 1.
Figure 17:
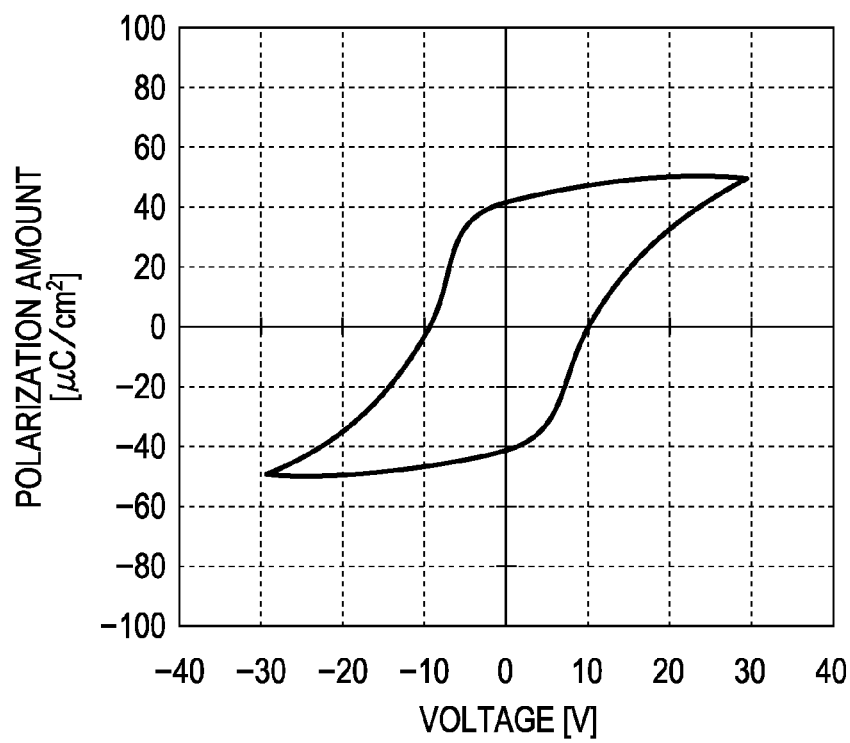
FIG. 17 is a diagram illustrating a P-V curve of Comparative Example 2.
Figure 18:
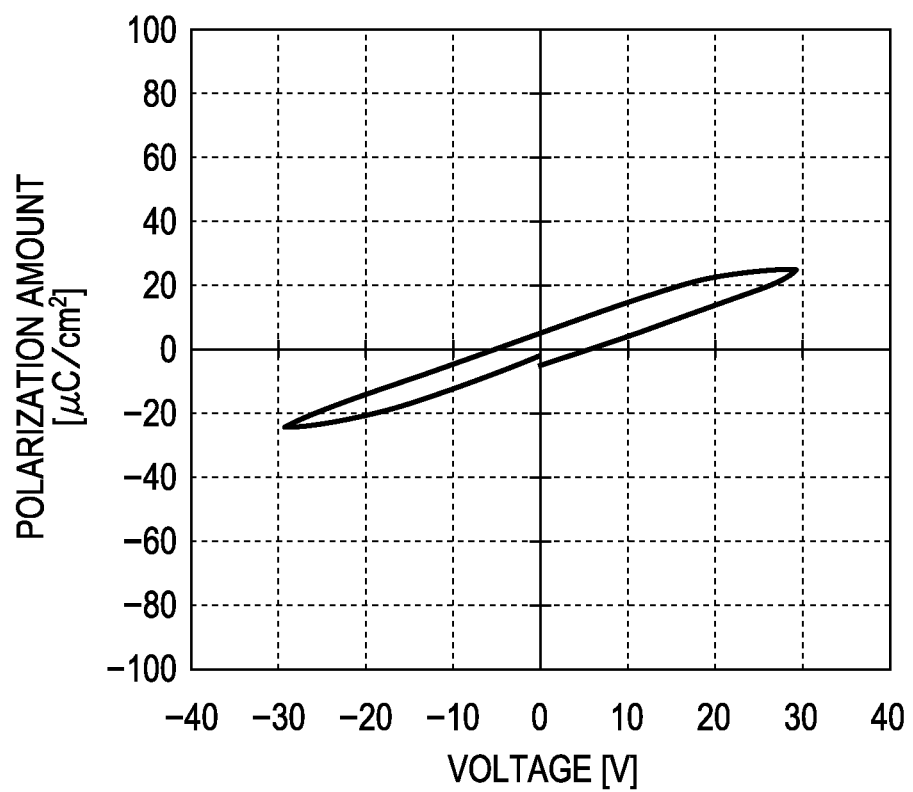
FIG. 18 is a diagram illustrating a P-V curve of Comparative Example 3.

This material showing such electric field induced phase transition is an anti-ferroelectric material. In other words, the anti-ferroelectric material is a material of which the polarization axes are alternately aligned in no electric field and of which the polarization axes are rotated so as to be aligned in the same direction by the electric field. With respect to such an anti-ferroelectric material, an example of P-V curve repressing a relationship between the polarization amount P of the anti-ferroelectric material and the voltage V has a double hysteresis which has a shape of two hysteresis loop in positive and electric field directions as illustrated in FIG. 4. In addition, in FIG. 4, the regions $V_F$ and $V_{AF}$ where the polarization amounts are rapidly changed are the site of phase transition from the ferroelectric phase to the anti-ferroelectric phase and the site of phase transition from the ferroelectric phase to the anti-ferroelectric phase. In addition, unlike the anti-ferroelectric material, the ferroelectric material allows the polarization direction to be aligned in one direction as illustrated in the hysteresis curve of the P-V curve, so that the strain amount is linearly changed with respect to the applied voltage.

In this manner, if the piezoelectric layer is made of a piezoelectric material showing electric field induced phase transition such as an $ABO_3$ type composite oxide containing Bi, La, Fe, and Mn and showing the electric field induced phase transition, the polarization amount is greatly changed by the electric field induced phase transition region, so that the electric field induced phase transition strain is generated. Therefore, since the lead content is decreased, the impact on the environment may be reduced, and a piezoelectric element having a large strain amount may be obtained.

In addition, with respect to the piezoelectric layer 70, if $0.24 \leq x \leq 0.33$ in the aforementioned general formula (1), a piezoelectric element having a larger strain amount may be obtained. In addition, if $0.27 \leq x \leq 0.29$, since the voltage where the piezoelectric layer 70 shows the electric field induced phase transition is stabilized, the strain amount of the piezoelectric element may be easily controlled. In addition, if $0.01 \leq y \leq 0.05$, the excellent leak characteristic may also be obtained.

The method of forming such a piezoelectric element 300 on the passage-forming substrate 10 is not particularly limited. For example, the following manufacturing method may be used. First, a silicon dioxide layer made of a silicon dioxide $(SiO_2)$, which is to constitute the elastic film 50, is formed on a surface of a wafer for a passage-forming substrate, which is a silicon wafer. Next, an insulating layer 55 made of zirconium oxide or the like is formed on the elastic film 50 (silicon dioxide layer).

Next, as needed, after a layer made of titanium oxide is formed on the insulating layer 55, a first electrode 60 made of platinum, iridium, or the like is formed on the entire surface by a sputtering method or the like, and after that, a patterning is performed.

Next, a piezoelectric layer 70 is laminated. A method of manufacturing the piezoelectric layer 70 is not particularly limited. However, for example, the piezoelectric layer 70 may be formed by using an MOD (Metal-Organic Decomposition) method, in which a solution obtained by dissolving and dispersing an organic metal compound with a solvent is coated and dried, and sintering is further performed, so that a piezoelectric layer 70 made of a metal oxide may be obtained. In addition, the method of manufacturing the piezoelectric layer 70 is not limited to the MOD method. For example, a colloidal solution-gel method, a laser ablation method, a sputtering method, a pulsed laser deposition method (PLD method), a CVD method, an aerosol deposition method, and the like may be used.

For example, a piezoelectric precursor film is formed on the first electrode 60 by coating a colloidal solution or an MOD solution (precursor solution), which includes organic metal compounds, particularly, organic metal compounds containing bismuth, lanthanum, iron, and manganese at a mixture ratio from which a desired composition ratio is obtained, by using a spin coating method (coating process).

The coating precursor solution is obtained by mixing organic metal compounds containing bismuth, lanthanum, iron, and manganese at a desired mole ratio and dissolving or dispersing the mixture with an organic solvent such as alcohol. As an organic metal compound containing bismuth, lanthanum, iron, or manganese, for example, a metal alkoxide, an organic acid salt, β-diketone complex, or the like may be used. As an organic metal compound containing bismuth, there is, for example, 2-ethyl hexanoate bismuth, or the like. As an organic metal compound containing lanthanum, there is, for example, 2-ethyl hexanoate lanthanum, or the like. As an organic metal compound containing iron, there is, for example, 2-ethyl hexanoate iron, or the like. As an organic metal compound containing manganese, there is, for example, 2-ethyl hexanoate manganese, or the like.

Next, the piezoelectric precursor film is heated at a predetermined temperature and dried for a predetermined time (drying process). Next, the dried piezoelectric precursor film is defatted by heating at a predetermined temperature and maintaining for a predetermined time (defatting process). In addition, the defatting referred herein denotes removing organic components contained in the piezoelectric precursor film by using, for example, $NO_2$, $CO_2$, $H_2O$, or the like.

Next, the piezoelectric precursor film is crystallized by heating at a predetermined temperature, for example, in a range of from about 600° C. to about 700° C. and maintaining for a predetermined time, so that a piezoelectric film is formed (sintering process). In addition, as a heating apparatus used for the drying process, the defatting process, and the sintering process, there is, for example, an RTA (Rapid Thermal Annealing) apparatus which performs heating by illumination of an infrared lamp, a hot plate, or the like.

In addition, a piezoelectric layer constructed with a plurality of piezoelectric films may be formed by repeating the aforementioned coating process, the drying process, and the defatting process or the coating process, the drying process, the defatting process, and the sintering process several times according to a desired thickness.

After the piezoelectric layer 70 is formed, a second electrode 80 made of, for example, a metal such as platinum is laminated on the piezoelectric layer 70, and the piezoelectric layer 70 and the second electrode 80 are simultaneously patterned, so that the piezoelectric element 300 is formed.

Next, as needed, post annealing may be performed in a temperature range of from 600° C. to 700° C. Therefore, it is possible to form a good interface between the piezoelectric layer 70 and the first electrode 60 or the second electrode 80, and it is possible to improve crystalline properties of the piezoelectric layer 70.

EXAMPLES

Hereinafter, the invention is described more in detail with reference to Examples. In addition, the invention is not limited to the following Examples.

Example 1

First, a silicon dioxide layer having a thickness of 400 nm is formed on a surface of a silicon substrate having (100) alignment by using thermal oxidation. Next, a titanium film having a thickness of 40 nm is formed on the silicon dioxide layer by using an RF sputtering method, and thermal oxidation is performed, so that a titanium oxide film is formed. Next, a platinum film having a thickness of 150 nm is formed on the titanium oxide film by using two steps of an ion sputter and a vapor deposition method, so that the first electrode 60 having (111) alignment is configured.

Next, a piezoelectric layer is formed on the first electrode 60 by a spin coating method. The process is as follows. First, xylene and octane solutions of 2-ethyl hexanoate bismuth, 2-ethyl hexanoate lanthanum, 2-ethyl hexanoate iron, and 2-ethyl hexanoate manganese are mixed at a predetermined ratio, so that a precursor solution is manufactured. Next, the precursor solution is dropped on the substrate where the titanium oxide film and the first electrode are formed, and the substrate is rotated at 1500 rpm, so that a piezoelectric precursor film is formed (coating process). Next, drying and defatting are performed at 350° C. for 3 minutes (drying and defatting process). The coating process and the drying and defatting process repeat three times, and after that, sintering is performed by using Rapid Thermal Annealing (RTA) at 650° C. for 1 minute (sintering process). The process including three-time repetition of the coating process and the drying and defatting process and, after that, the sintering process of sintering at one time is repeated four times. By performing the sintering by using the RTA at 650° C. for 10 minutes, total 12-times coating is performed, so that the piezoelectric layer 70 having a total thickness of 350 nm is formed.

Next, a platinum film having a thickness of 100 nm is formed as a second electrode 80 on the piezoelectric layer 70 by using a DC sputtering method, and after that, sintering is performed by using the RTA at 650° C. for 10 minutes, so that a piezoelectric element 300 having an $ABO_3$ type composite oxide as the piezoelectric layer 70 expressed by the aforementioned general formula (I) with x=0.21 and y=0.03 is formed.

Examples 2 to 11 and Comparative Examples 1 to 6

Piezoelectric elements 300 are formed in the same conditions as those of Example 1 except for changing a mixture ratio of xylene solution of 2-ethyl hexanoate bismuth, 2-ethyl hexanoate lanthanum, 2-ethyl hexanoate iron, and 2-ethyl hexanoate manganese and octane solution and having composites oxide expressed by the aforementioned general formula (1) with x and y listed in Table 1 as each of the piezoelectric layers 70.

TABLE 1

|  | x | y |
|---|---|---|
| Example 1 | 0.21 | 0.03 |
| Example 2 | 0.24 | 0.03 |
| Example 3 | 0.24 | 0.05 |
| Example 4 | 0.28 | 0.01 |
| Example 5 | 0.29 | 0.02 |
| Example 6 | 0.29 | 0.03 |
| Example 7 | 0.29 | 0.05 |
| Example 8 | 0.28 | 0.07 |
| Example 9 | 0.27 | 0.09 |
| Example 10 | 0.33 | 0.05 |
| Example 11 | 0.38 | 0.05 |
| Comparative Example 1 | 0.20 | 0.01 |
| Comparative Example 2 | 0.19 | 0.05 |
| Comparative Example 3 | 0.48 | 0.05 |
| Comparative Example 4 | 0.30 | 0.00 |
| Comparative Example 5 | 0.10 | 0.00 |
| Comparative Example 6 | 0.00 | 0.00 |

Test Example 1

With respect to each of the piezoelectric elements 300 of Examples 1 to 11 and Comparative Examples 1 to 6, a P (polarization amount)-V (voltage) relationship is measured with "FCE-1A" of TOYO Corporation by using an electrode pattern having $\phi$=400 μm and applying a triangular wave having a frequency of 1 kHz. The results are illustrated in FIGS. 5 to 18. In addition, in Comparative Examples 4 to 6, since the leak is too large, the measurement is not performed, and it may not be used as a piezoelectric material.

As illustrated in FIGS. 5 to 15, in Examples 1 to 11, it is understood that the material is a material which has a double hysteresis curve and has the polarization amount with respect to the threshold value according to the voltage applying as a boundary and which shows the electric field induced phase transition where the polarization amount is rapidly decreased by setting the voltage as zero, that is, the anti-ferroelectric material. Therefore, Examples 1 to 11 are piezoelectric material representing large strain with an area showing the electric field induced phase transition.

In addition, it is understood that, in Examples 4 to 9 where $0.27 \leq x \leq 0.29$ in the general formula (1), the voltage showing the electric field induced phase transition is particularly stabilized. In addition, it is understood that, in Examples 1 to 7 and 10 to 11 where $0.01 \leq y \leq 0.05$ in the general formula (1), the leak characteristic is particularly excellent.

On the other hand, it is understood that Comparative Examples 1 and 2 where x and y are outside the range of $0.21 \leq x \leq 0.38$ and $0.01 \leq x \leq 0.09$ in the general formula (1) are ferroelectric materials since the hysteresis having spontaneous polarization unique to the ferroelectric material is shown, that Comparative Example 3 is a paraelectric material, that Comparative Examples 4 to 6 may not used as a piezoelectric material as described above, and that any of the Comparative Examples are not anti-ferroelectric material showing the electric field induced phase transition.

Test Example 2

Figure 19:
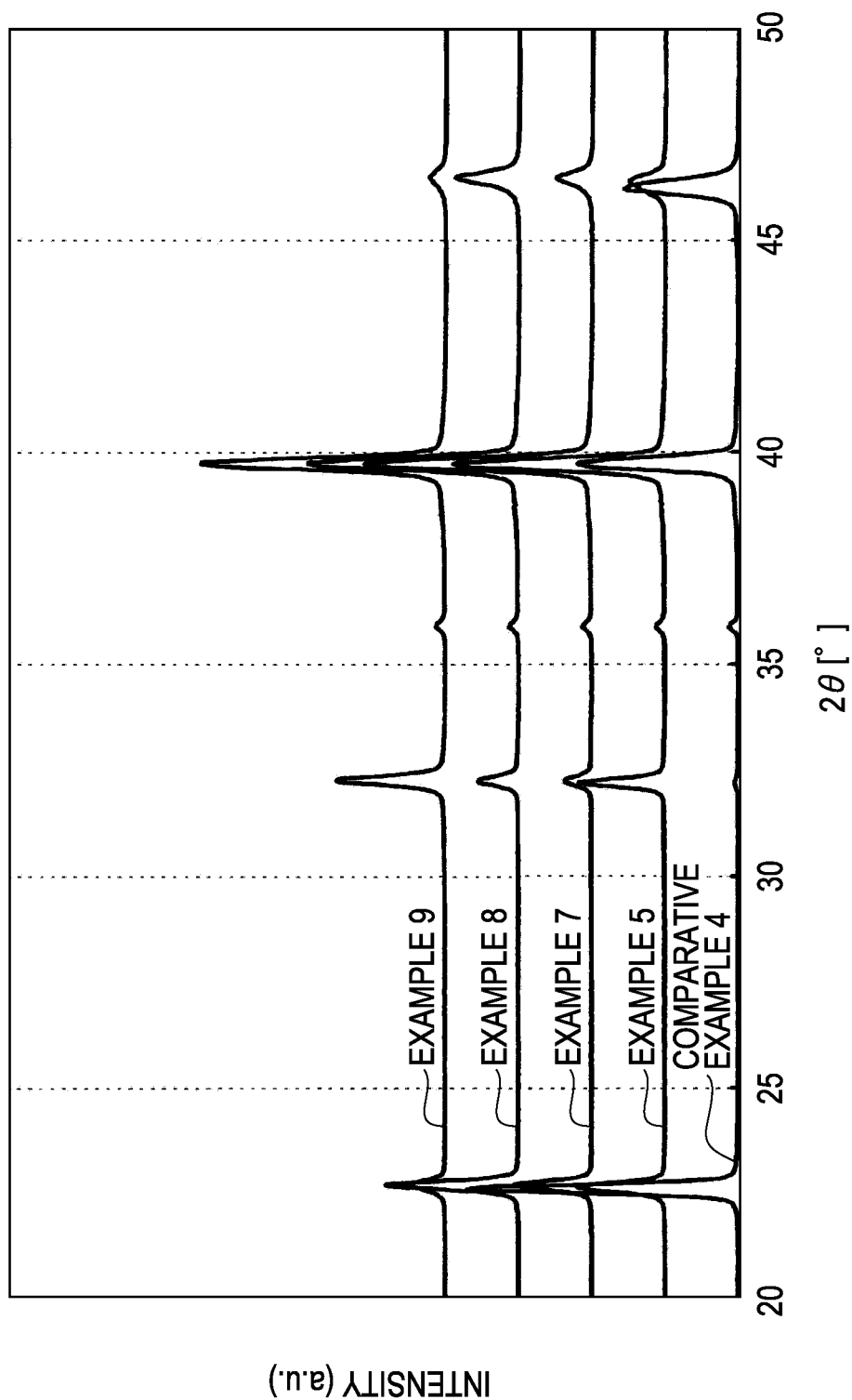
FIG. 19 is a diagram illustrating an X-ray diffraction pattern of Test Example 2.
Figure 20:
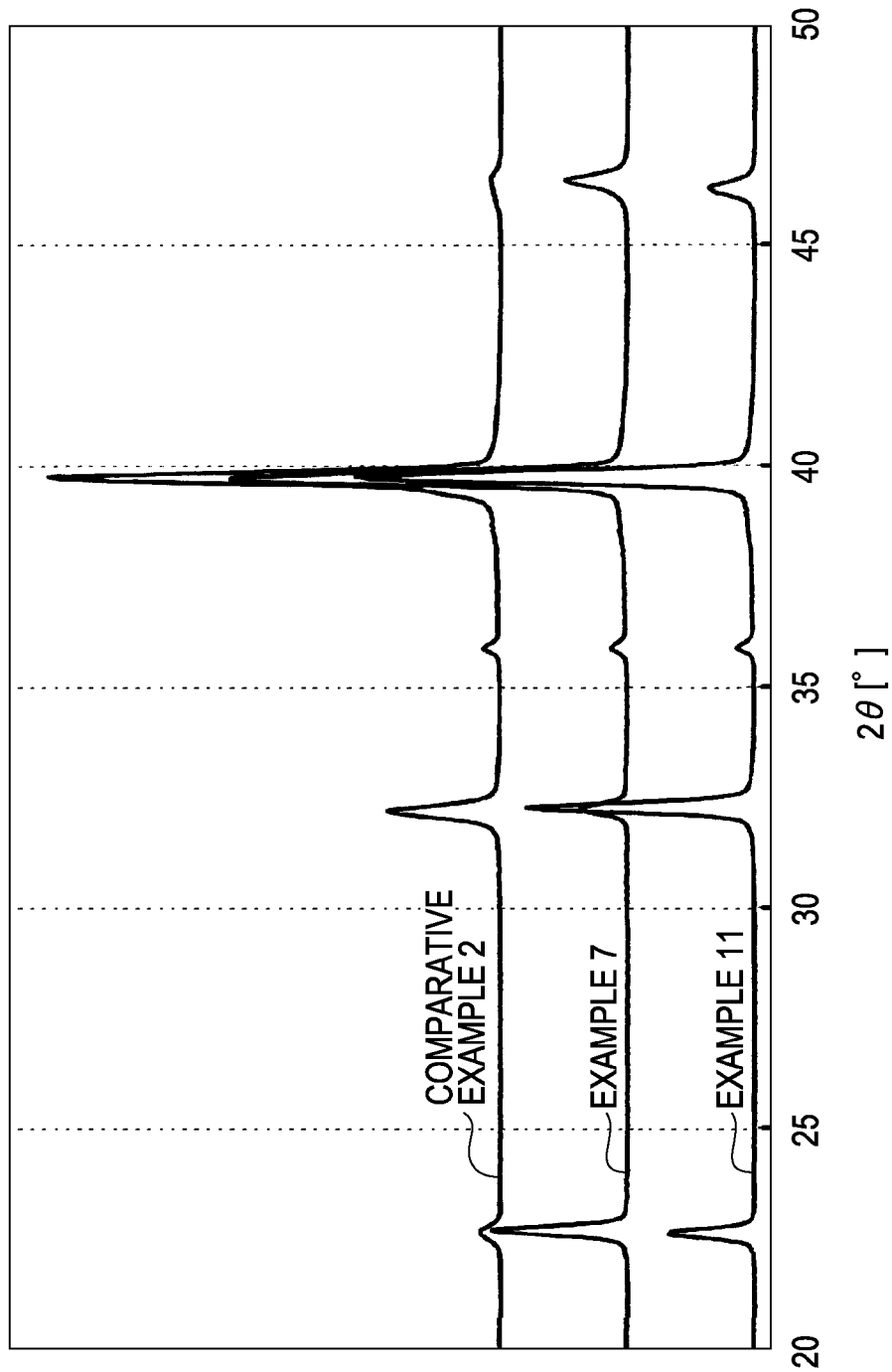
FIG. 20 is a diagram illustrating an X-ray diffraction pattern of Test Example 2.

With respect to the piezoelectric elements 300 of Examples 1 to 11 and Comparative Examples 1 to 6, X-ray diffraction patterns are obtained at the room temperature by using Cu Kα line as the X-ray source in "D8 Discover" of Bruker AXS. As a result, in all of Examples 1 to 11 and Comparative Examples 1 to 6, diffraction peaks derived from $ABO_3$, diffraction peaks derived from Pt (111), and diffraction peaks derived from Cu Kβ line of Pt (111) are observed. It may be understood from the above result that each of the piezoelectric layers of Examples 1 to 11 and Comparative Examples 1 to 6 is formed to have an $ABO_3$ type structure. As an example of the result, as the diagrams illustrating the relationship between diffraction intensities and diffraction angle 2θ, X-ray diffraction patterns of Example 5, 7, 8, 9, and Comparative Example 4 are illustrated in FIG. 19, and X-ray diffraction patterns of Example 7, 11, and Comparative Example 2 are illustrated in FIG. 20.

Test Example 3

Figure 21:
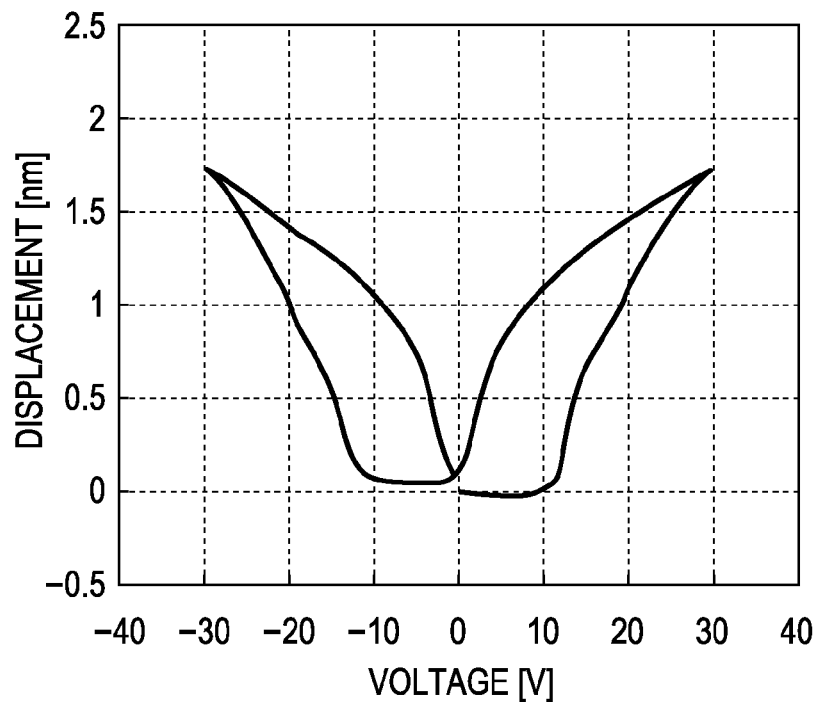
FIG. 21 is a diagram illustrating an S-V curve of Example 7.
Figure 22:
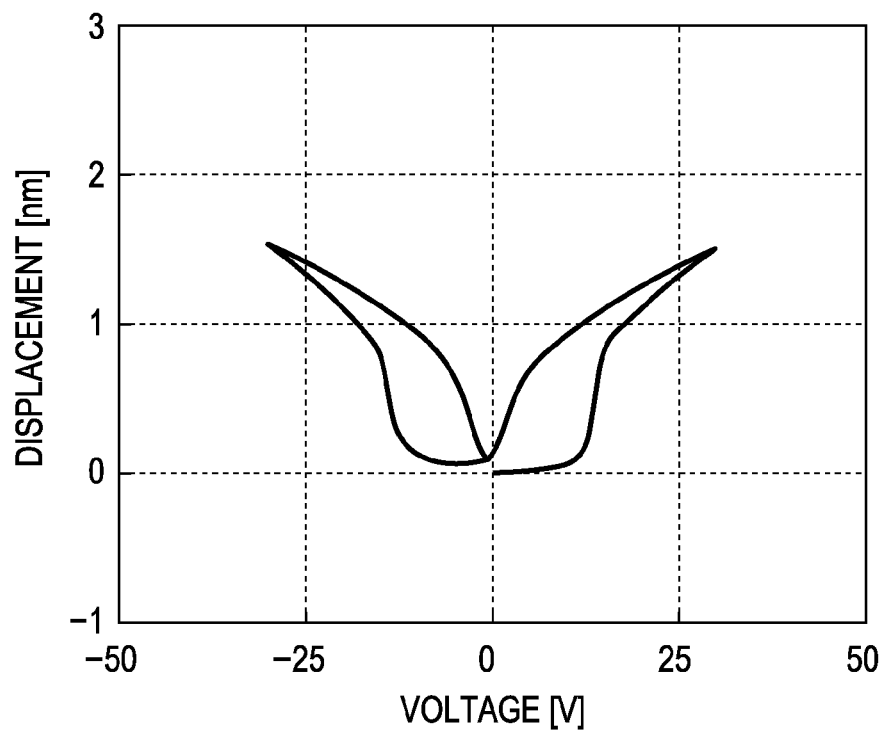
FIG. 22 is a diagram illustrating an S-V curve of Example 6.
Figure 23:
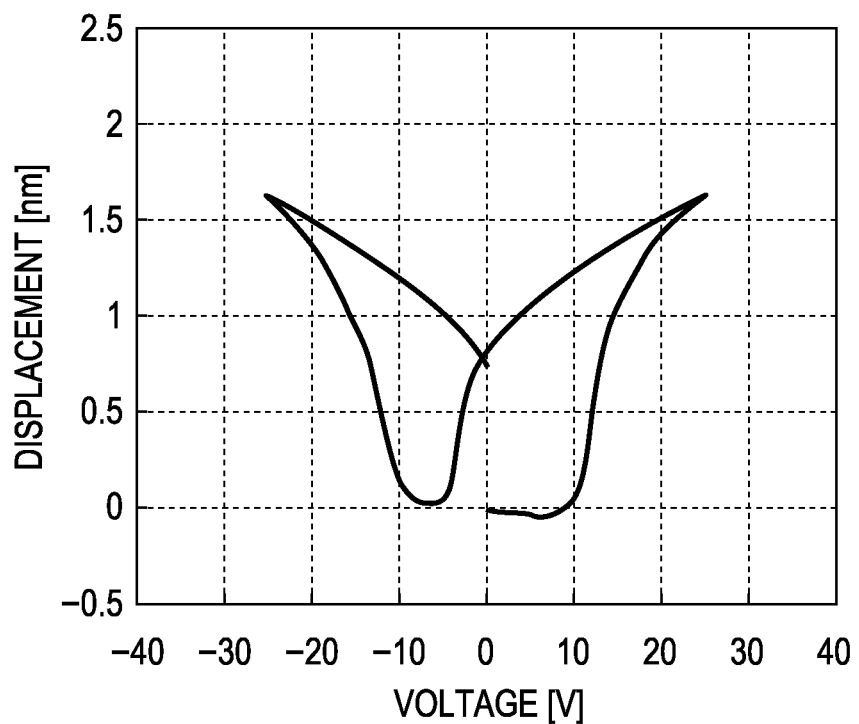
FIG. 23 is a diagram illustrating an S-V curve of Example 3.

With respect to the piezoelectric elements 300 of Examples 1 to 11, S (electric field induced strain)-V (voltage) relationships in the orientation (33 direction) parallel to the voltage applied direction are obtained at the room temperature by using an electrode pattern of ϕ=500 μm and applying a voltage having a frequency of 1 kHz in a displacement measurement apparatus (DBLI) of aixACCT. As a result, it is observed in all Examples 1 to 11 that a large change in strain ratio occurs to be equal to or larger than the threshold voltage as illustrated in P-V hysteresis of FIGS. 5 to 15, and a very large piezoelectric strain equal to or larger than 0.3% occurs with 30 V applied. As an example of the result, Examples 7, 6, and 3 are illustrated in FIGS. 21 to 23.

A lead electrode 90 which is made of, for example, gold (Au) or the like and which is disposed to extend from the vicinity of the end of the ink supplying path 14 to the insulating layer 55 is connected to each of the second electrodes 80, which are individual electrodes of the piezoelectric elements 300.

A protective substrate 30 having a reservoir portion 31 constituting at least a portion of a reservoir 100 is adhered by an adhesive 35 on the passage-forming substrate 10, on which the piezoelectric elements 300 is formed, that is, on the first electrode 60, the insulating layer 55, and the lead electrode 90. In the embodiment, the reservoir portion 31 is formed in the thickness direction of the pressure generation chambers 12 by puncturing the protective substrate 30 in the thickness direction thereof to communicate with the communicating portion 13 of the passage-forming substrate 10 as described above, so that the reservoir 100 which becomes a common ink chamber of the pressure generation chambers 12 is configured. In addition, the communicating portion 13 of the passage-forming substrate 10 may be partitioned into a plurality of communicating portions for the pressure generation chambers 12, and only the reservoir portion 31 may be referred to as a reservoir. In addition, for example, only the pressure generation chambers 12 may be provided to the passage-forming substrate 10, and the ink supplying path 14 communicating with the reservoir and the pressure generation chambers 12 may be provided to a member (for example, the elastic film 50, the insulating layer 55, or the like) interposed between the passage-forming substrate 10 and the protective substrate 30.

In addition, a piezoelectric element holding portion 32 having a space to the extent that the portion does not obstruct the movement of the piezoelectric element 300 is disposed in the region facing the piezoelectric element 300 of the protective substrate 30. If the piezoelectric element holding portion 32 has a space to the extent that the portion does not obstruct the movement of the piezoelectric element 300, the configuration is sufficient. The space may be sealed or not sealed.

As the protective substrate 30, it is preferable that a material having substantially the same thermal expansion ratio as that of the passage-forming substrate 10, for example, a glass, a ceramic material, or the like is used. In the embodiment, the protective substrate 30 is formed by using a single-crystalline silicon substrate which is the same as that of the passage-forming substrate 10.

In addition, a through-hole 33 penetrating the protective substrate 30 in the thickness direction is provided to the protective substrate 30. In addition, the vicinities of the end portions of the lead electrodes 90 lead out from the piezoelectric elements 300 are configured to be exposed to an inner portion of the through-hole 33.

In addition, a driving circuit 120 for driving the piezoelectric elements 300 disposed in parallel is fixed on the protective substrate 30. As the driving circuit 120, for example, a circuit board, a semiconductor integrated circuit (IC), or the like may be used. In addition, the driving circuit 120 and the lead electrodes 90 are electrically connected to each other through connection wire lines 121 made of a conductive wire such as a bonding wire.

In addition, a compliance substrate 40 constructed with a sealing film 41 and a fixing plate 42 is adhered on the protective substrate 30. Herein, the sealing film 41 is made of a flexible material having low rigidity, and the one surface of the reservoir portion 31 is sealed with the sealing film 41. In addition, the fixing plate 42 is constructed with a relatively soft material. Since the region facing the reservoir 100 of the fixing plate 42 becomes an opening portion 43 which is entirely removed in the thickness direction, the one surface of the reservoir 100 is sealed with only the sealing film 41 having flexibility.

In the ink jet type recording head I according to the embodiment, ink is received from an ink introducing inlet connected to an external ink supplying unit (not shown). After the inner portion is filled with the ink until the ink reaches from the reservoir 100 to the nozzle orifices 21, a voltage is applied between the first electrode 60 and the second electrode 80 corresponding to each of the pressure generation chambers 12 according to the recording signal from the driving circuit 120, so that the elastic film 50, the insulating layer 55, the first electrode 60, and the piezoelectric layer 70 are deformed so as to be deflected. Accordingly, the pressure of the inner portion of each of the pressure generation chambers 12 is increased, so that ink droplets are ejected from the nozzle orifices 21.

Since the piezoelectric material (anti-ferroelectric material) showing the electric field induced phase transition, which is used as the piezoelectric layer 70 of the ink jet type recording apparatus, has different behaviors from the ferroelectric material, in order to drive the ink jet type recording apparatus with a desired amplitude, the driving unit of supplying to the piezoelectric element different signals from the driving signals in the case using the ferroelectric material in the related art may have to be configured. The following description is made in detailed by exemplifying the piezoelectric element 300 of Example 6.

Figure 24:
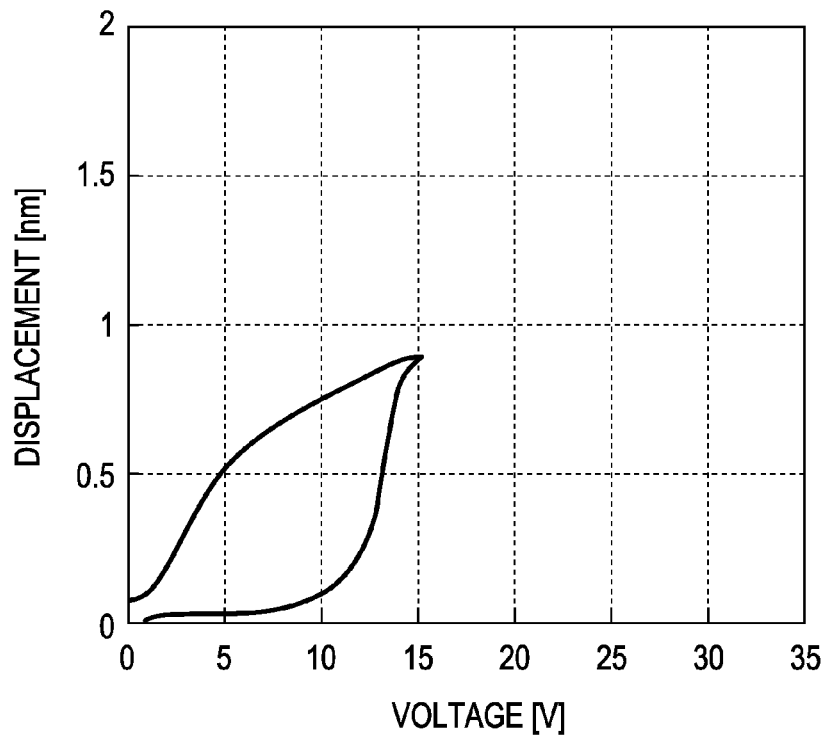
FIG. 24 is a diagram illustrating an S-V curve at 15 V of Example 6.
Figure 25:
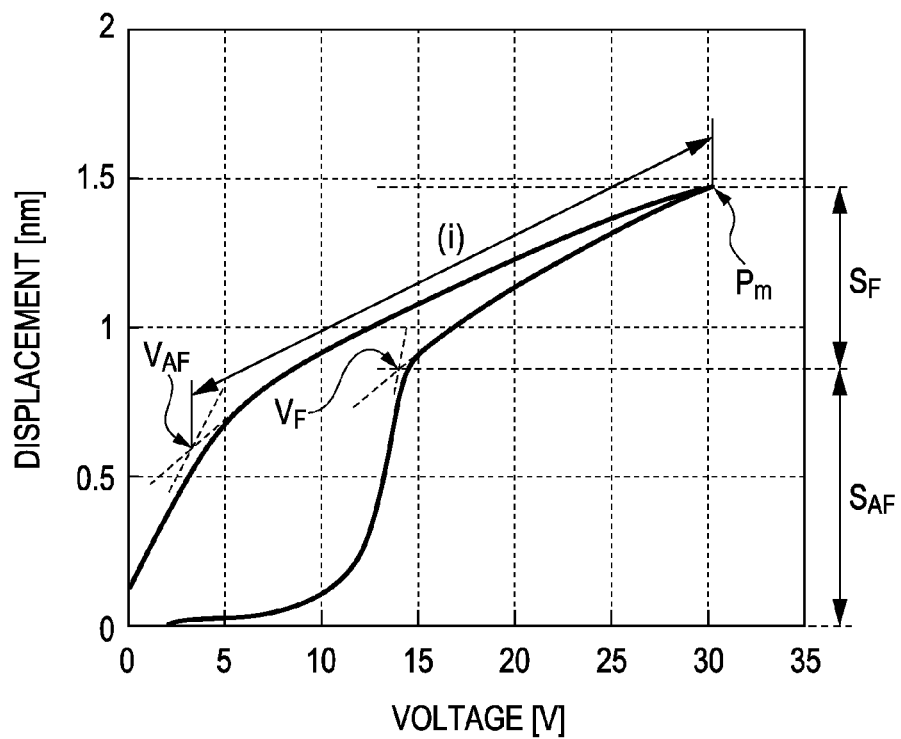
FIG. 25 is a diagram illustrating an S-V curve at 30 V of Example 6.
Figure 26:
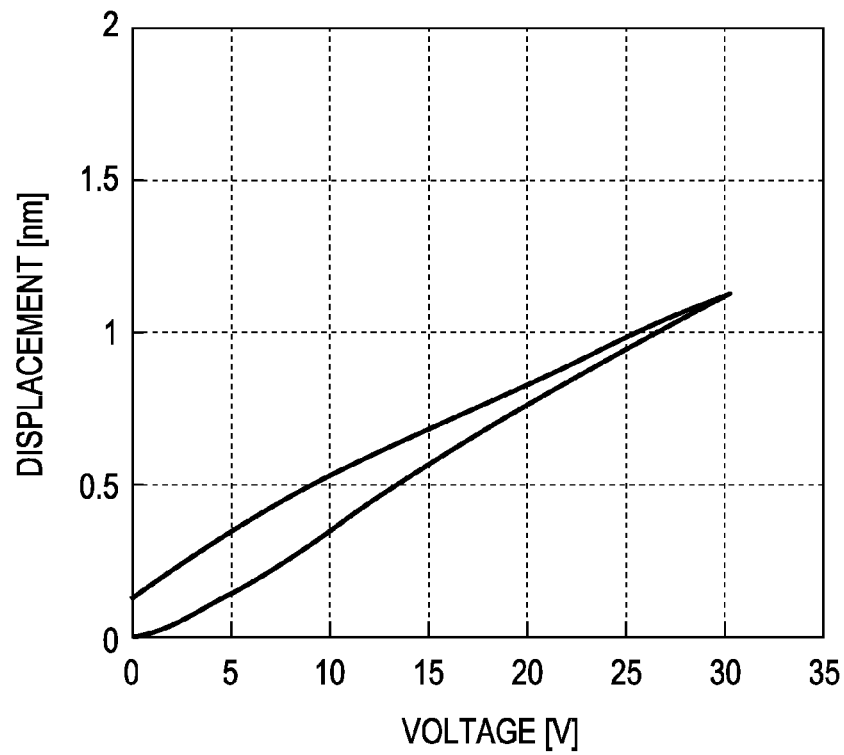
FIG. 26 is a diagram illustrating an S-V curve at 30 V of a ferroelectric material.

First, in Example 6, the electric field induced strain-voltage plots measured in uni-polar by DBLI are illustrated in FIGS. 24 and 25. In addition, FIG. 24 corresponds to the measurement at the time of applying a voltage of 15 V, and FIG. 25 corresponds to the measurement at the time of applying a voltage of 30 V. In addition, similarly to the ferroelectric material, the electric field induced strain-voltage plot at the time of applying a voltage of 30 V is illustrated in FIG. 26. As illustrated in FIG. 26, in the case of the ferroelectric material, the electric field induced strain is linearly changed with respect to a change in voltage. On the other hand, as illustrated in FIG. 24, in Example 6 which is an anti-ferroelectric material, by applying a 15 V triangular wave, a non-linear electric field induced strain is observed in a range of 10 to 15 V, and a displacement of 0.89 nm is observed. If reduced as a strain ratio, this becomes 0.26%, which is a very large strain. The strain is derived from the electric field induced phase transition from the anti-ferroelectric phase to the ferroelectric phase. In addition, as illustrated in FIG. 25, by applying a 30 V triangular wave, in addition to the strain caused by the aforementioned electric field induced phase transition, an area where the strain is linearly changed with respect to an applied voltage ranging from 15 to 30 V is newly observed. The strain is derived from the inverse piezoelectric effect of the ferroelectric material. Therefore, at 30 V, as a sum of the strain of the electric field induced phase transition and the strain of the inverse piezoelectric effect, a displacement of 1.47 nm is observed. If this is reduced as a strain ratio, it becomes 0.43%, which is a very large strain. As illustrated in FIG. 25, the strain derived from the electric field induced phase transition is defined as $S_{AF}$, and the strain derived from the inverse piezoelectric effect is defined as $S_F$.

In addition, as illustrated in FIGS. 24 and 25, when the phase transition from the anti-ferroelectric phase to the ferroelectric phase occurs due to the electric field induced phase transition, since the phase transition is a primary phase transition, there is a hysteresis in the electric field. As illustrated in FIG. 25, among the voltages at the intersections of the extrapolating lines of the strain amounts, the voltage having a higher absolute value is indicated by $V_F$, and the voltage having a lower absolute value is indicated by $V_{AF}$. It is understood that the strain due to the inverse piezoelectric effect is observed in the region of from $V_F$ to $V_{AF}$.

Figure 27:
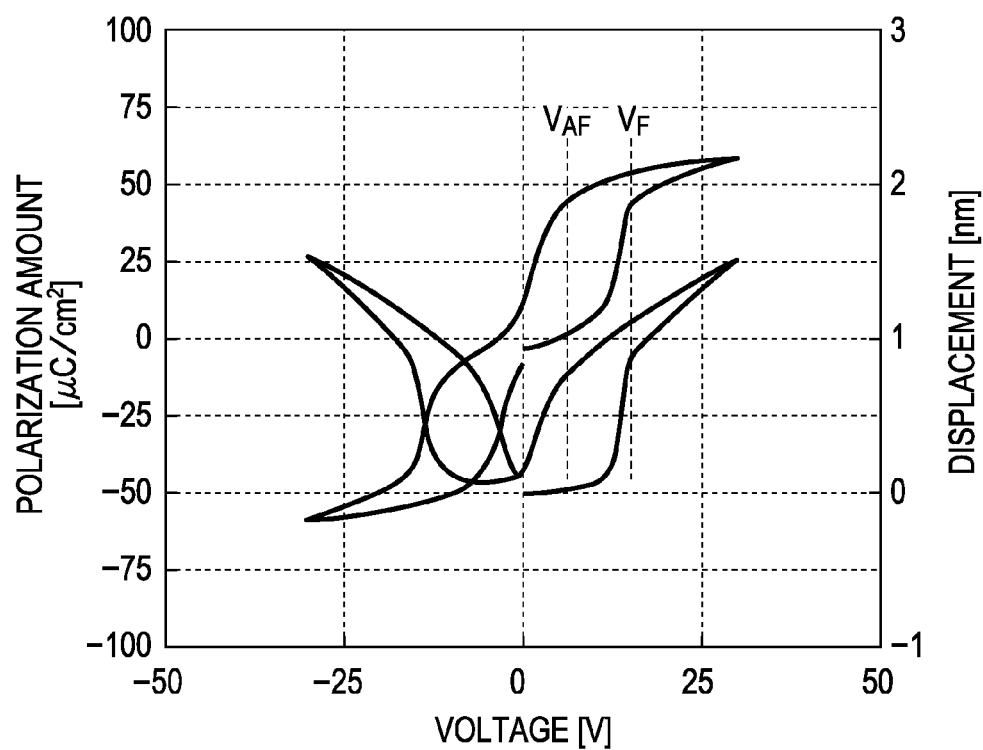
FIG. 27 is a diagram simultaneously illustrating a P-V curve and an S-V curve of Example 6.
Figure 28:
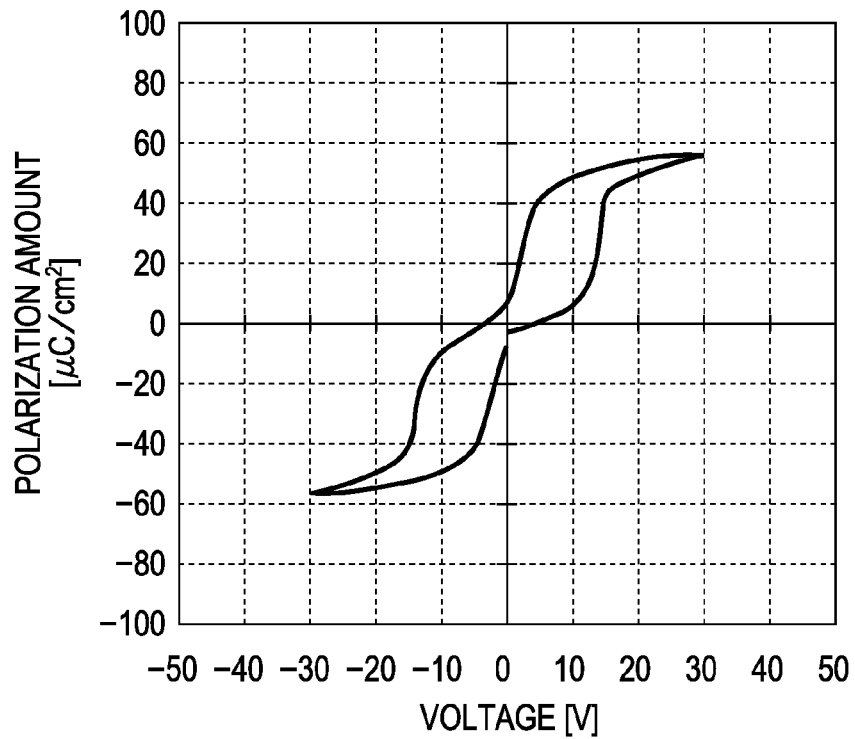
FIG. 28 is a diagram illustrating a frequency tracking ability (1 kHz) measured in Example 6.
Figure 29:
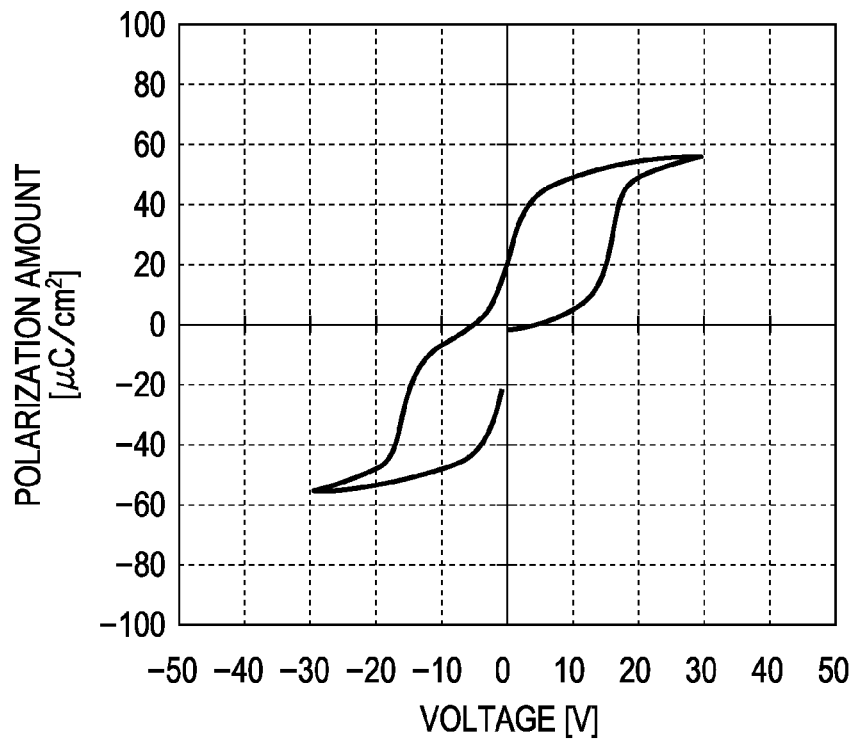
FIG. 29 is a diagram illustrating a frequency tracking ability (10 kHz) measured in Example 6.
Figure 30:
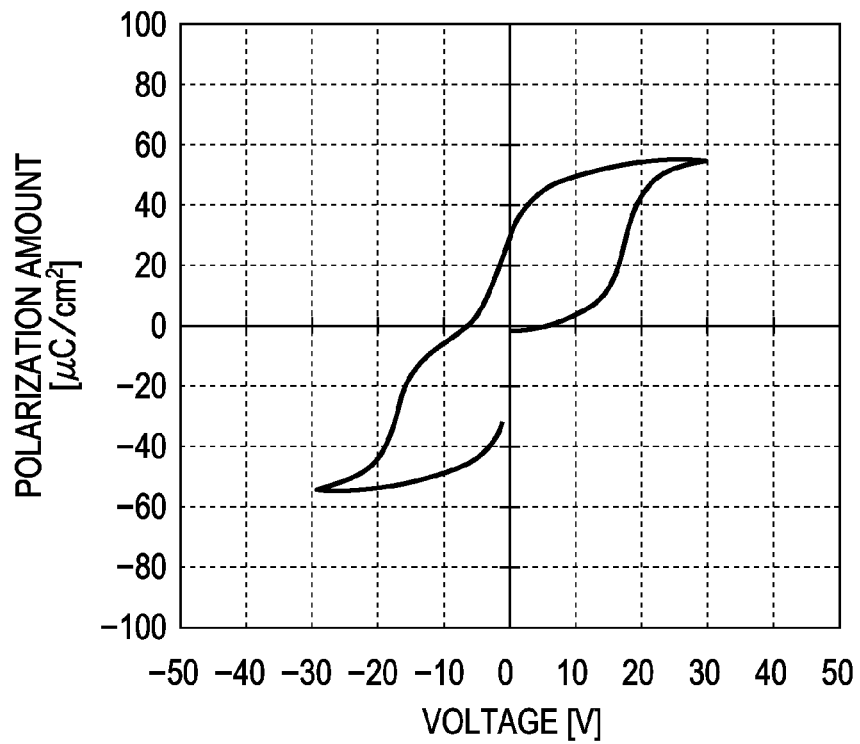
FIG. 30 is a diagram illustrating a frequency tracking ability (20 kHz) measured in Example 6.
Figure 31:
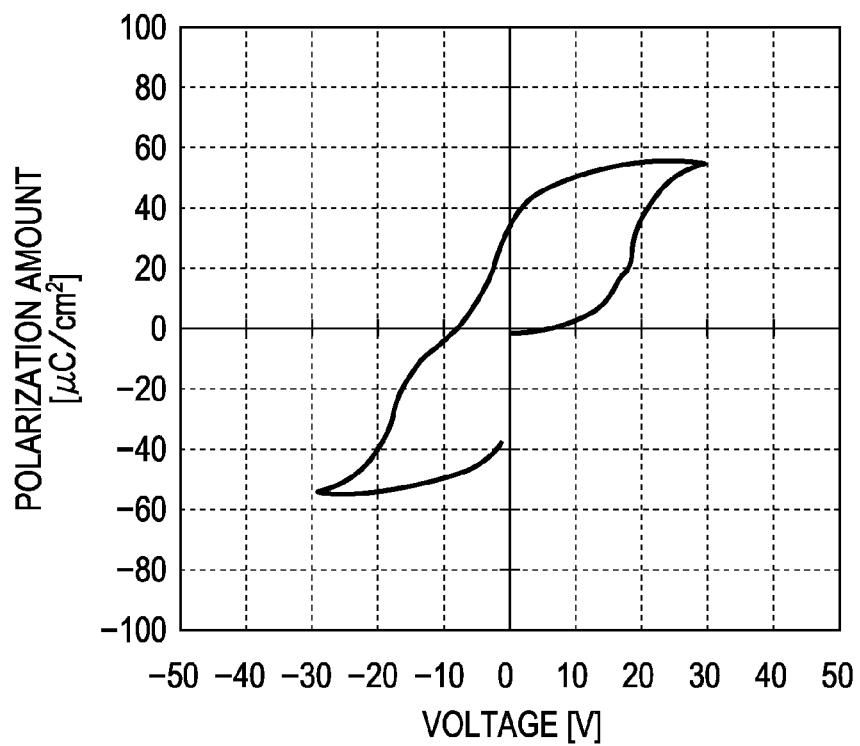
FIG. 31 is a diagram illustrating a frequency tracking ability (30 kHz) measured in Example 6.
Figure 32:
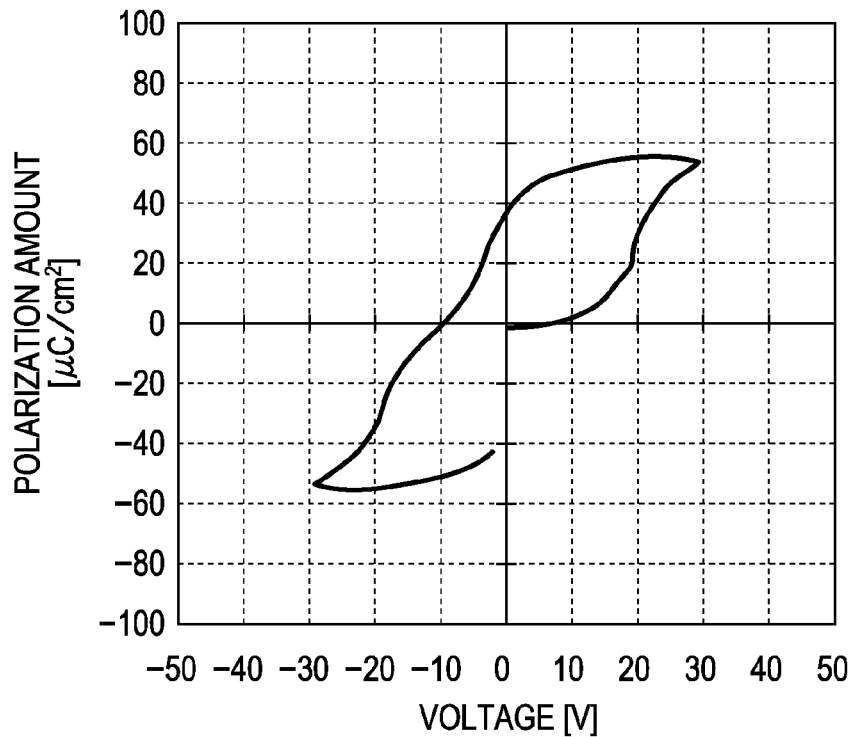
FIG. 32 is a diagram illustrating a frequency tracking ability (40 kHz) measured in Example 6.
Figure 33:
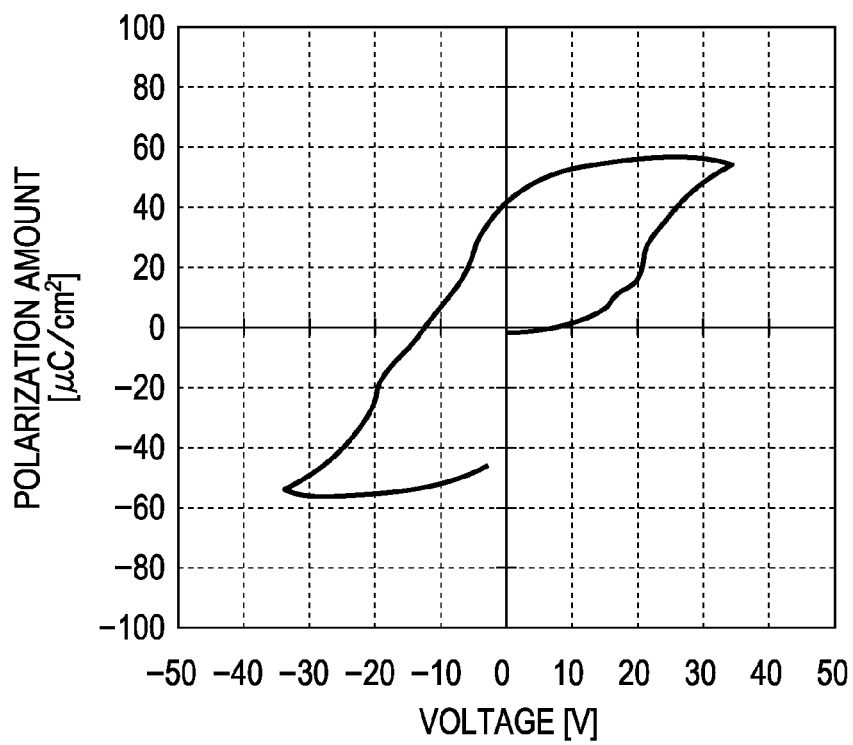
FIG. 33 is a diagram illustrating a frequency tracking ability (50 kHz) measured in Example 6.

In addition, as illustrated in FIG. 27 where the P-V curve of Example 6 and the S-V plot in the DBLI are simultaneously illustrated, the $V_F$ and the $V_{AF}$ are coincident with the pole changing points of the charge amount in the P-V curve. Therefore, it is understood that, in the examination of the driving waveform, the pattern of the electric field induced strain due to the voltage applying may be inferred from the measurement of the charge amount.

In addition, the frequency tracking abilities in the P-V curves are measured by using TFA2000HS of aixACCT with electrode pattern having φ=500 μm at 1 kHz, 10 kHz, 20 kHz, 30 kHz, 40 kHz, and 50 kHz. As sequentially illustrated in FIGS. 28 to 33, it is observed that the P-V curves have double hysteresis unique to an anti-ferroelectric material at all the frequencies of 1 kHz to 50 kHz. In addition, by comparing FIGS. 28 to 33, it is seen that the hysteresis tends to be thickened as the frequency is increased. However, this is a problem of the measurement apparatus but not a problem intrinsic to the material. It is understood from the above results that the piezoelectric material (Examples) showing the anti-ferroelectricity may be tracked up to at least 50 kHz.

Figure 34:
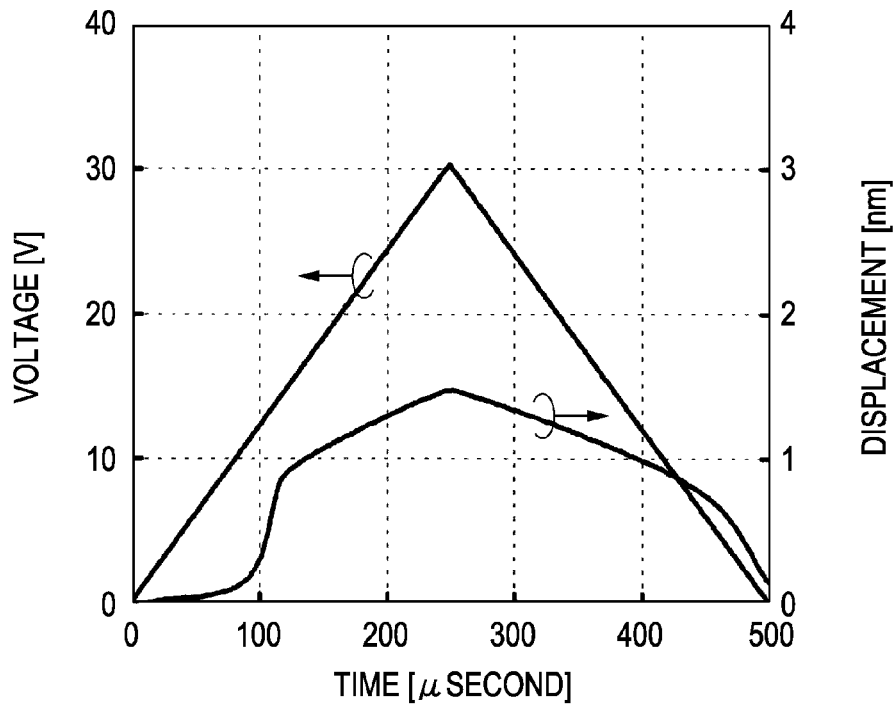
FIG. 34 is a diagram illustrating a voltage-time plot and a electric field induced strain-time plot of an anti-ferroelectric material at 30 V.
Figure 35:
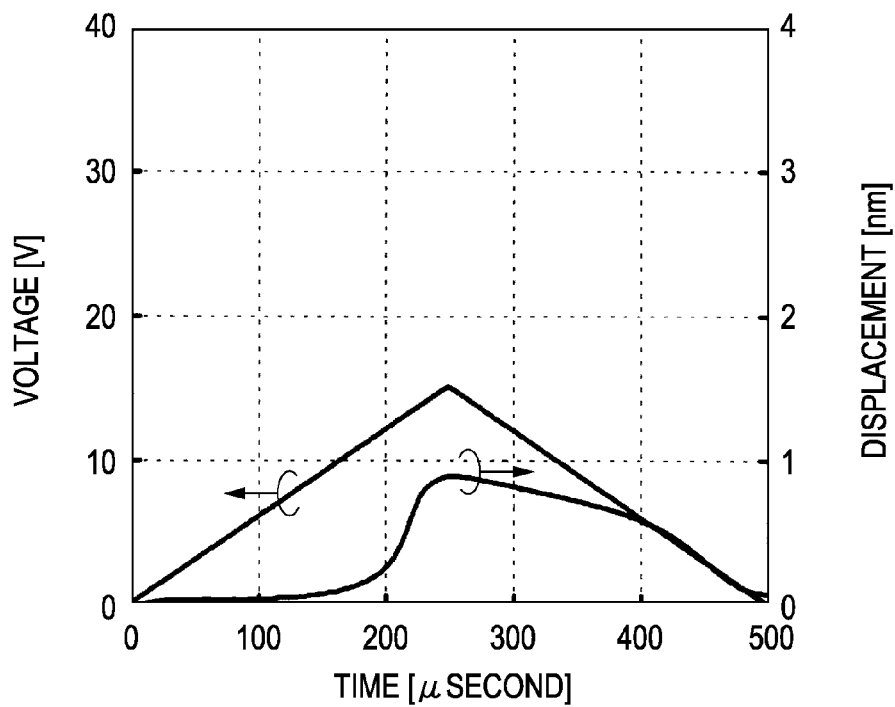
FIG. 35 is a diagram illustrating a voltage-time plot and a electric field induced strain-time plot of an anti-ferroelectric material at 15 V.
Figure 36:
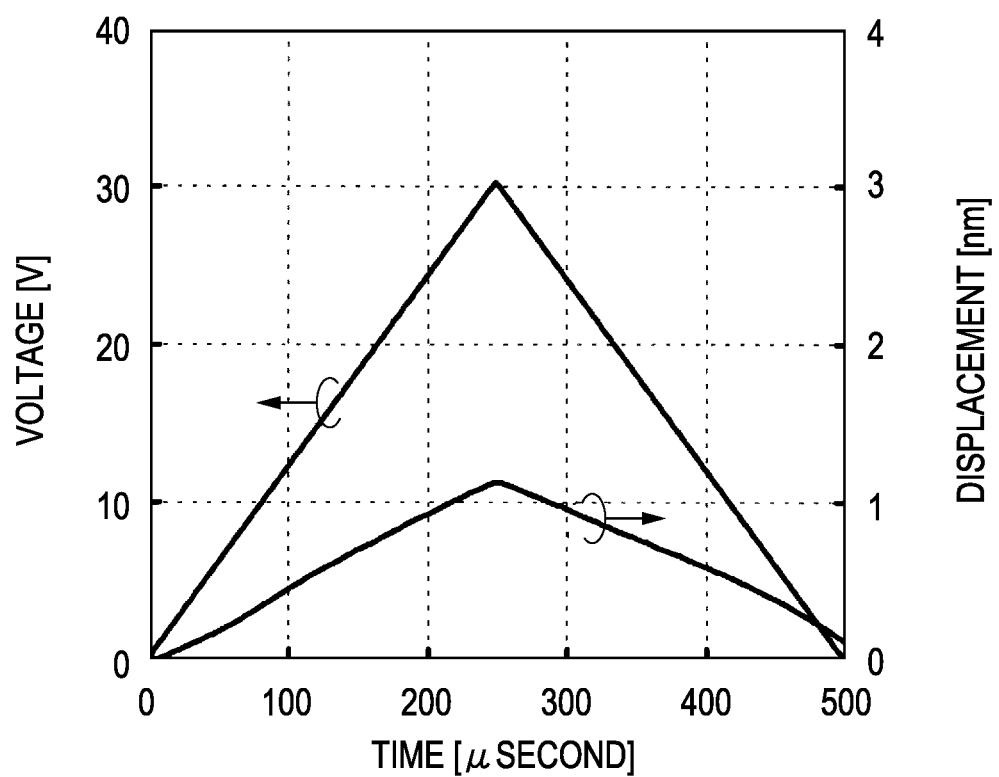
FIG. 36 is a diagram illustrating a voltage-time plot and a electric field induced strain-time plot of a ferroelectric material at 30 V.

Next, in the case of the anti-ferroelectric material of Example 6 or the like, diagrams plotting the voltage and the displacement amount with respect to time are illustrated in FIGS. 34 and 35. In addition, FIG. 34 corresponds to the case of applying a voltage of 30 V, and FIG. 35 corresponds to the case of applying a voltage of 15 V. In addition, similarly to the ferroelectric material, a diagram plotting the voltage and the displacement amount with respect to time in the case of applying 30 V is illustrated in FIG. 36. As illustrated in FIG. 36, in the ferroelectric material, the shape of voltage-time plot and the shape of electric field induced strain-time plot are coincident with each other. On the other hand, in the anti-ferroelectric material, as illustrated in FIG. 34, in the voltage-time plot at the time of applying a voltage sufficiently higher than $V_F$, the electric field induced strain is bent unlike the ferroelectric material. The bent curve corresponds to $V_F$ and $V_{AF}$ in the electric field induced strain-voltage plot. In addition, the steeply rising portion at the low electric filed side corresponds to $S_{AF}$, and the linear strain at the high electric field side corresponds to $S_F$. Therefore, in FIG. 35 where the voltage is raised up to only the vicinity of $V_F$, when the voltage is raised, only the strain of $S_{AF}$ is observed. However, when the voltage is fallen down, both of $S_F$ and $S_{AF}$ are observed.

As described above, the piezoelectric response to the voltage of the anti-ferroelectric material is different from that of the ferroelectric material, there may have to be used a waveform optimized for the anti-ferroelectric material in order to drive anti-ferroelectric material as a piezoelectric element.

Figure 37:
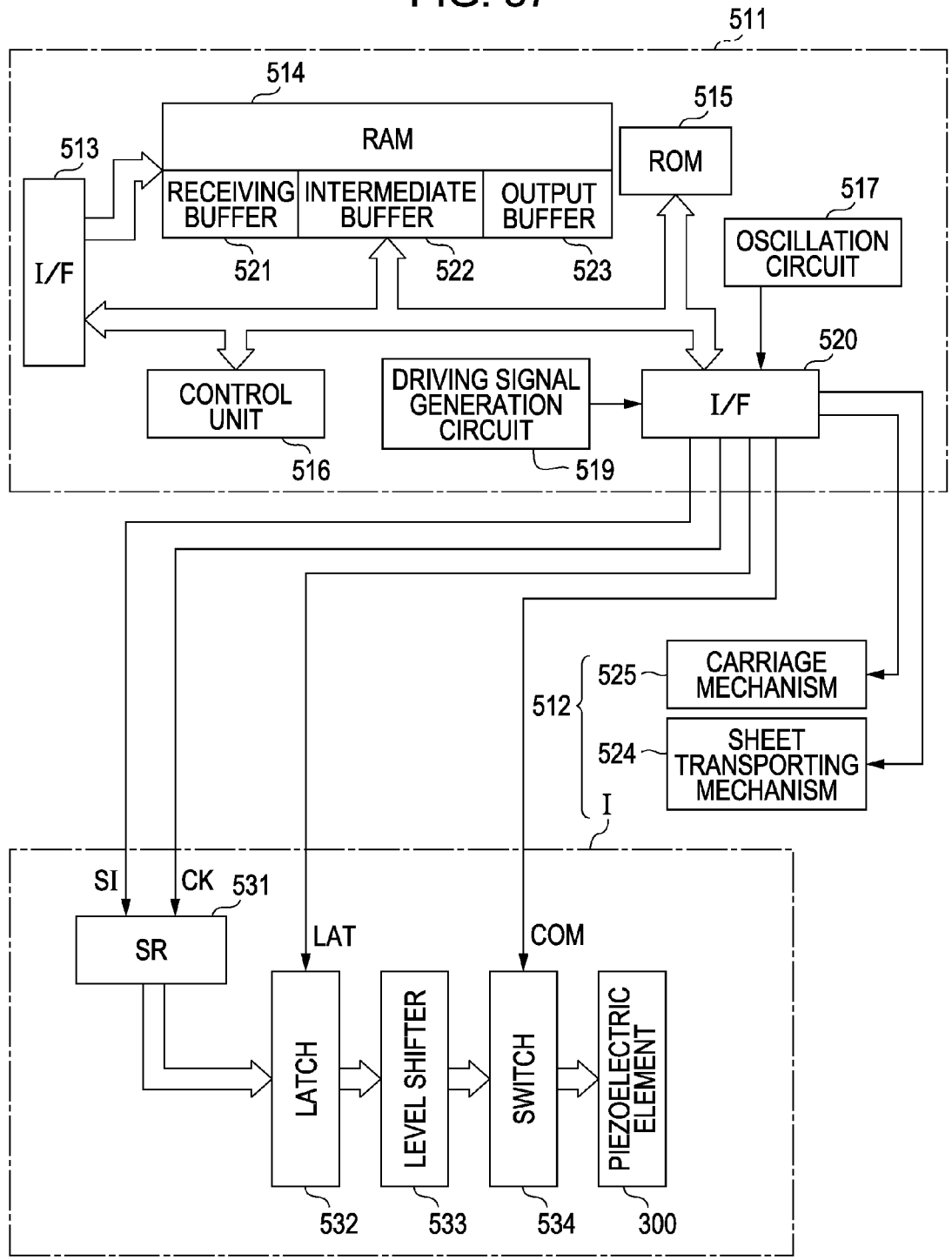
FIG. 37 is a block diagram illustrating a control configuration of an ink jet type recording apparatus.

FIG. 37 is a block diagram illustrating a control configuration of an ink jet type recording apparatus. The control of the ink jet type recording apparatus according to the embodiment is described with reference to FIG. 37. As illustrated in FIG. 37, the ink jet type recording apparatus according to the embodiment schematically includes a printer controller 511 and a print engine 512. The printer controller 511 includes an external interface 513 (hereinafter, referred to as an external I/F 513), a RAM 514 which temporarily stores various data, a ROM 515 which stores a control programs or the like, a control unit 516 which is configured to include a CPU and the like, an oscillation circuit 517 which generates a clock signal, a driving signal generation circuit 519 which generates a driving signal to be supplied to the ink jet type recording head I, and an internal interface 520 (hereinafter, referred to as an internal I/F 520), which transmits to the print engine 512 a dot pattern data (bitmap data) or the like which is developed based on the driving signal or printing data.

The external I/F 513 receives from a host computer (not shown) or the like, for example, a character code, a graphic function, and printing data constructed with an image data or the like. In addition, a busy signal (BUSY) or an acknowledge signal (ACK) is output through the external I/F 513 to the host computer or the like. The RAM 514 functions as a receiving buffer 521, an intermediate buffer 522, an output buffer 523, and a work memory (not shown). In addition, the receiving buffer 521 temporarily stores the printing data received by the external I/F 513. The intermediate buffer 522 temporarily stores an intermediate code data which is converted by the control unit 516. The output buffer 523 stores the dot pattern data. In addition, the dot pattern data is constructed with printing data which is obtained by decoding (translating) a grayscale data.

In addition, the ROM 515 is allowed to store font data, graphic functions, or the like as well as control programs (control routines) for performing various data processes.

The control unit 516 reads the printing data from the receiving buffer 521 and stores the intermediate code data obtained by converting the printing data in the intermediate buffer 522. In addition, the control unit 516 analyzes the intermediate code data read from the intermediate buffer 522 and develops the intermediate code data into the dot pattern data by referring to the font data and the graphic functions stored in the ROM 515. In addition, after applying a necessary decorating process, the control unit 516 stores the developed dot pattern data in the output buffer 523. In addition, the control unit 516 also functions as a waveform setting unit, which controls the driving signal generation circuit 519 to set the waveform shape of the driving signal generated from the driving signal generation circuit 519. The control unit 516 together with the later-described driving circuit (not shown) and the like constitutes the driving unit according to the invention. In addition, a liquid ejection driving unit which drives the ink jet type recording head I may include at least the driving unit. In the embodiment, a case where the printer controller 511 is included is exemplified.

In addition, if the dot pattern data corresponding to one row of the ink jet type recording heads I are obtained, the dot pattern data corresponding to the one row are output through the internal I/F 520 to the ink jet type recording heads I. In addition, if the dot pattern data corresponding to the one row are output from the output buffer 523, the developed intermediate code data are erased from the intermediate buffer 522, and the developing process is performed on the next intermediate code data.

The print engine 512 is configured to include the ink jet type recording head I, a sheet transporting mechanism 524, and a carriage mechanism 525. The sheet transporting mechanism 524 is constructed with a sheet transporting motor, the platen 8, and the like so as to sequentially transport a print storage medium such as a recording sheet in cooperation with the recording operation of the ink jet type recording head I. In other words, the sheet transporting mechanism 524 allows the print storage medium to be relatively moved in the sub scan direction.

The carriage mechanism 525 is constructed with the carriage 3, on which the ink jet type recording head I may be mounted, and a carriage driving unit, which drives the carriage 3 to move in the main scan direction. By driving the carriage 3 to move, the ink jet type recording head I is moved in the main scan direction. In addition, as described above, the carriage driving unit is constructed with the driving motor 6, the timing belt 7, and the like.

The ink jet type recording head I has a plurality of the nozzle orifices 21 in the sub scan direction so as to eject liquid droplets from the nozzle orifices 21 at the timing defined by the dot pattern data or the like. In addition, the piezoelectric elements 300 of the ink jet type recording head I are supplied with electric signals, for example, the later-described driving signal (COM), the recording data (SI), or the like through external wire lines (not shown). In the printer controller 511 and the print engine 512 having such a configuration, a driving circuit (not shown) which includes a latch 532, a level shifter 533, a switch 534, and the like and which selectively inputs to the piezoelectric elements 300 a driving signal having a predetermined driving waveform output from the printer controller 511 and the driving signal generation circuit 519 becomes a driving unit which applies a predetermined driving signal to the piezoelectric elements 300.

In addition, the shift register (SR) 531, the latch 532, the level shifter 533, the switch 534, and the piezoelectric element 300 are disposed to each of the nozzle orifices 21 of the ink jet type recording head I. The shift register 531, the latch 532, the level shifter 533, and the switch 534 generate a driving pulse from an ejection driving signal or a relaxation driving signal generated by the driving signal generation circuit 519. Herein, the driving pulse is an applied pulse which is actually applied to the piezoelectric element 300.

In such an ink jet type recording head I, first, in synchronization with a clock signal (CK) from the oscillation circuit 517, recording data (SI) constituting the dot pattern data are serially transmitted from the output buffer 523 to the shift register 531 to be sequentially set. In this case, first, the highest bit data of the printing data for the entire nozzle orifices 21 are serially transmitted. If the serial transmission of the highest bit data is ended, the second bit data with respect to the highest position are serially transmitted. Hereinafter, similarly, the lower bit data are sequentially serially transmitted.

In addition, the bit data of the recording data for the entire nozzles are set to the shift registers 531, the control unit 516 outputs latch signals (LAT) to the latches 532 at predetermined timings. According to the latch signal, the latch 532 latches the printing data set in the shift register 531. The recording data (LATout) latched by the latch 532 is applied to the level shifter 533, which is a voltage amplifier. In the case where the recording data is, for example, "1", the level shifter 533 boosts the recording data up to a voltage value where the switch 534 is drivable, for example, several tens of volts. In addition, the boosted recording data is applied to each switch 534, so that each switch 534 is allowed to be in the connected state by the recording data.

In addition, the driving signal (COM) generated by the driving signal generation circuit 519 is also applied to each switch 534. If the switch 534 is selectively in the connected state, the driving signal is selectively applied to the piezoelectric element 300 connected to the switch 534. In this manner, in the exemplified ink jet type recording head I, it may be controlled based on the recording data whether or not the ejection driving signal is applied to the piezoelectric element 300. For example, in the period where the recording data is "1", since the switch 534 is in the connected state by the latch signal (LAT), the driving signal (COMout) may be supplied to the piezoelectric element 300. Therefore, by the supplied driving signal (COMout), the piezoelectric element 300 is displaced (deformed). In addition, in a period where the recording data is "0", since the switch 534 is in the non-connected state, the supplying of the driving signal to the piezoelectric element 300 is blocked. In the period where the recording data is "0", since the piezoelectric element 300 maintains a preceding potential, the preceding displacement state is maintained.

In addition, the aforementioned piezoelectric element 300 is a piezoelectric element 300 of a flexural vibration mode. If the piezoelectric element 300 of the flexural vibration mode is used, the piezoelectric layer 70 is contracted in the direction (31 direction) perpendicular to the voltage according to the voltage applying, the piezoelectric element 300 and the vibration plate are bent toward the pressure generation chamber 12. Therefore, the pressure generation chamber 12 is contracted. On the other hand, by decreasing the voltage, the piezoelectric layer 70 is extended in the 31 direction, so that the piezoelectric element 300 and the vibration plate are bent toward the opposite side of the pressure generation chamber 12. Therefore, the pressure generation chamber 12 is expanded. In such an ink jet type recording head I, since the volume of the pressure generation chamber 12 is changed according to the charging and discharge of the corresponding piezoelectric element 300, the liquid droplets may be ejected from the nozzle orifices 21 by using the change in pressure of the pressure generation chamber 12.

Now, a driving waveform representing a driving signal (COM) according to the embodiment, which is input to the piezoelectric element 300 is described. First, the displacement in the 31 direction associated with the flexural vibration mode has a linear relationship with the displacement in the 33 direction obtained by DBLI. More specifically, by attaching a minus constant to the displacement in the 33 direction, a displacement amount of a flexural displacement may be approximately obtained. From this result, a behavior of the displacement at the time of applying a voltage to the piezoelectric element using an anti-ferroelectric material simply in a range from zero volt is described with reference to FIGS. 38 and 39 illustrating a voltage-time plot, a 33-directional electric field induced strain-time plot, and a vibration plate displacement-time plot.

Figure 38:
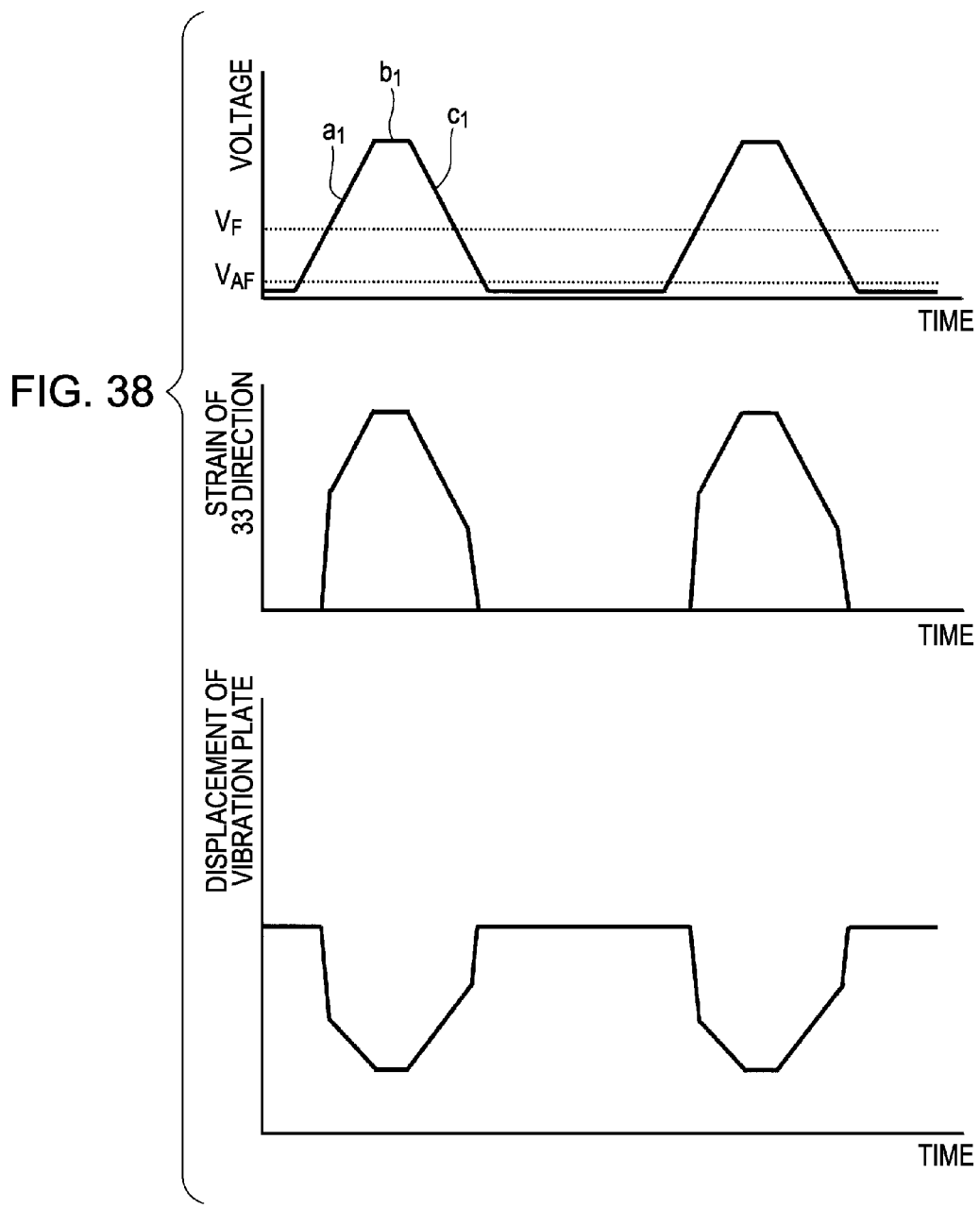
FIG. 38 is a diagram illustrating a behavior of a displacement at the time of applying a high voltage to a piezoelectric element using an anti-ferroelectric material.

As illustrated in FIG. 38, in the voltage increasing process $a_1$, when the voltage is sufficiently lower than $V_F$, the displacement in the 33 direction is not changed, but in the narrow voltage range in the vicinity of the $V_F$, the displacement is greatly changed by $S_{AF}$. When the voltage is higher than $V_F$, the displacement amount is monotonously increased as the voltage is increased by $S_F$. Next, a holding process $b_1$ is performed, and after that, in the voltage decreasing process $c_1$, the displacement amount is monotonously decreased as the voltage is decreased in a shape corresponding to $S_F$ before $V_{AF}$, but the displacement is greatly changed in the narrow voltage range in a shape corresponding to $S_{AF}$ in the vicinity of $V_{AF}$. In addition, in FIG. 38, actually measured values of the case where the start point voltage=0, the maximum voltage=30 V, the holding process $b_1$=250 μsec, and the minimum voltage=0 correspond to those of FIG. 34. With respect to the displacement of the vibration plate, in the corresponding voltage increasing process $a_1$, when the voltage is sufficiently lower than $V_F$, the displacement of the vibration plate is not changed, but in the narrow voltage range in the vicinity of $V_F$, the displacement of the vibration plate is greatly changed in a shape where the pressure generation chamber 12 is contracted. When the voltage is higher than $V_F$, the displacement of the vibration plate is monotonously increased as the voltage is increased, so that the pressure generation chamber 12 is contracted. Next, the holding process $b_1$ is performed, and after that, in the voltage decreasing process $c_1$, the displacement is monotonously changed in a shape where the pressure generation chamber 12 is expanded as the voltage is decreased before $V_{AF}$, but the displacement is greatly changed in a shape where the pressure generation chamber 12 is expanded in the vicinity of $V_{AF}$.

Figure 39:
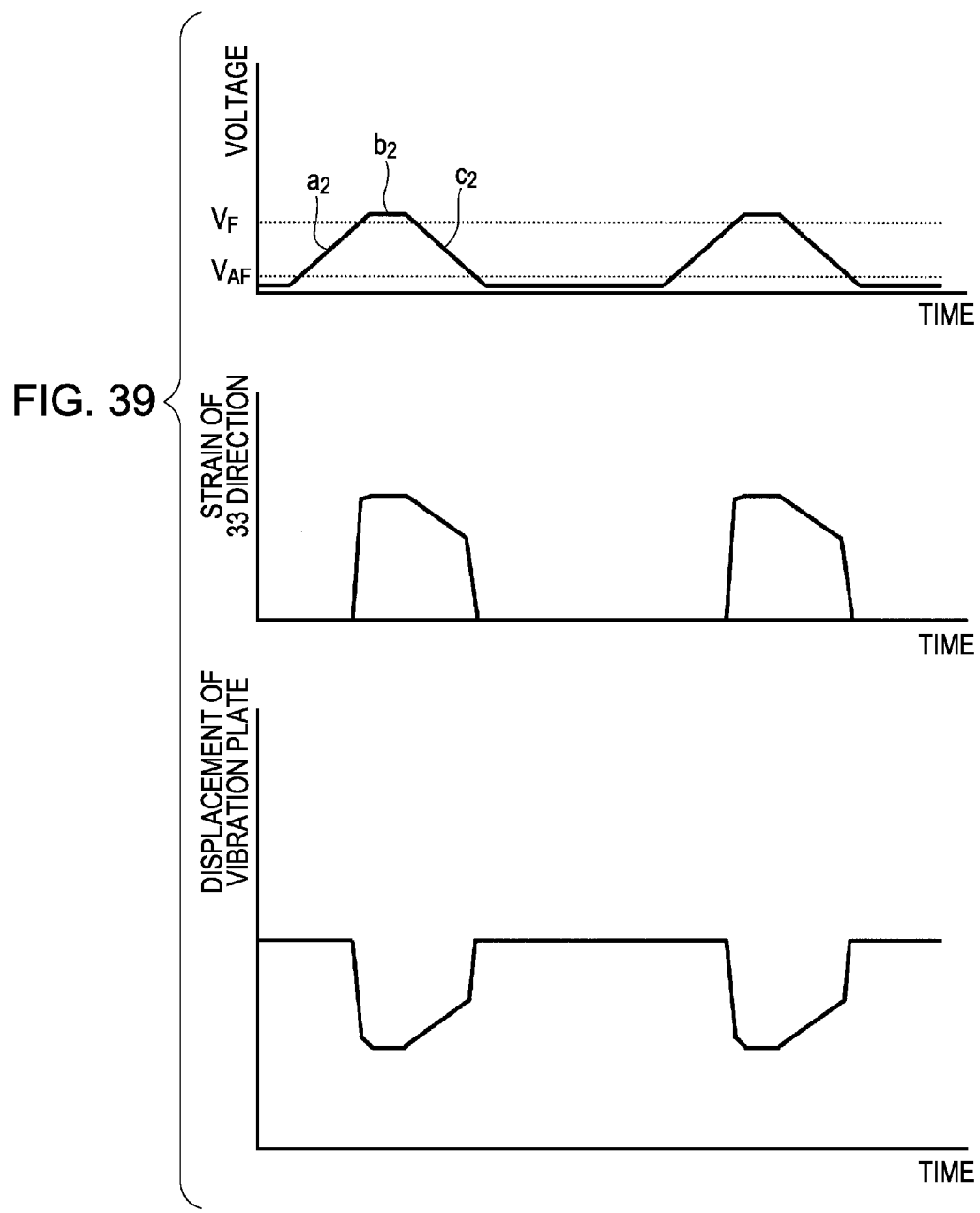
FIG. 39 is a diagram illustrating a behavior of a displacement at the time of applying a low voltage to a piezoelectric element using an anti-ferroelectric material.

In addition, as illustrated in FIG. 39, in the voltage increasing process $a_2$, when the voltage is sufficiently lower than $V_F$, the displacement in the 33 direction is not changed, but in the narrow voltage range in the vicinity of $V_F$, the displacement in the 33 direction is greatly changed by $S_{AF}$. Next, a holding process $b_2$ is performed, and after that, in the voltage decreasing process $c_2$, the displacement amount is monotonously decreased as the voltage is decreased in a shape corresponding to $S_F$ before $V_{AF}$, but the displacement is greatly changed in the narrow voltage range in a shape corresponding to $S_{AF}$ in the vicinity the case where the start point voltage=0, the maximum voltage=15 V, the holding process $b_2$=250 μsec, and the minimum voltage=0 correspond to FIG. 35. With respect to the displacement of the vibration plate, in the corresponding voltage increasing process $a_2$, when the voltage is sufficiently lower than $V_F$, the displacement of the vibration plate is not changed, but in the in the narrow voltage range in the vicinity of $V_F$, the displacement of the vibration plate is greatly changed in a shape where pressure generation chamber 12 is contracted. Next, the holding process $b_2$ is performed, and after that, in the voltage decreasing process $c_2$, the displacement is monotonously changed in a shape where the pressure generation chamber 12 is expanded as the voltage is decreased before $V_{AF}$, but the displacement is greatly changed in a shape where the pressure generation chamber 12 is expanded in the vicinity of $V_{AF}$.

As described above, since the anti-ferroelectric material has the ferroelectric phase region (inverse piezoelectric effect) where the displacement amount is increased or decreased according to a change in voltage and the anti-ferroelectric phase region (electric field induced phase transition strain) where the displacement is greatly changed in the narrow voltage range, a desired amplitude may not be obtained by driving the anti-ferroelectric material by using the driving signal similar to that for a general ferroelectric material.

However, if the piezoelectric element is driven in the ferroelectric phase region, that is, the region where the displacement amount is linearly changed, it is possible to generate a small amplitude (micro vibration) by decreasing the applied voltage. In other words, a driving signal which allows the voltage to be applied to the piezoelectric layer, allows the voltage which passes through $V_F$ and of which the absolute value is equal to or higher than $V_{AF}$ to be set as a start point, and allows the voltage to be changed within a range where the absolute value is equal to or higher than $V_{AF}$ is supplied to the piezoelectric element, so that it is possible to generate a small amplitude. More specifically, for example, in FIG. 25, it may be driven within the region indicated by (i). In addition, in FIG. 25, $P_m$ denotes saturated polarization.

Figure 40:
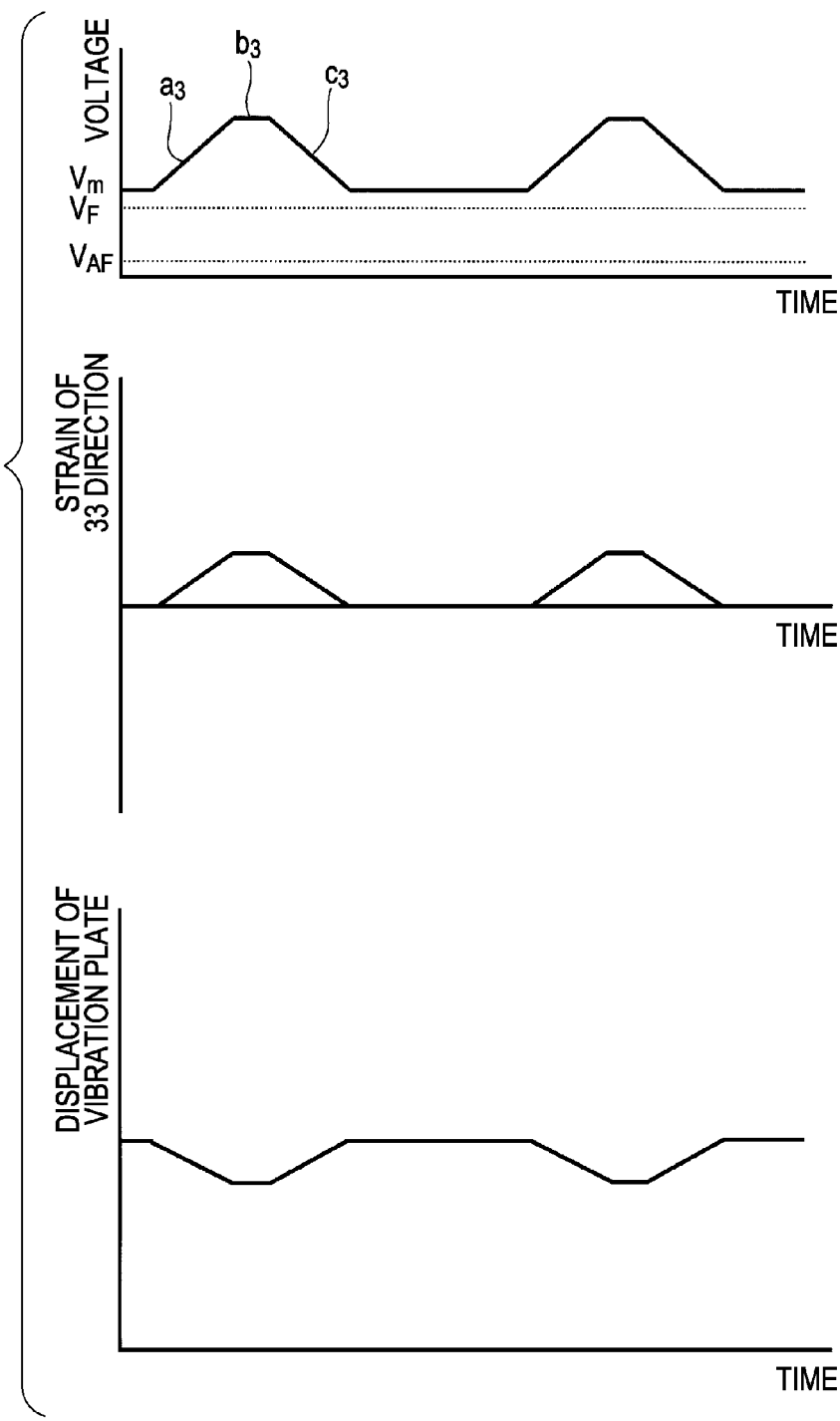
FIG. 40 is a diagram illustrating a driving waveform having a small amplitude.

As a detailed example of a small amplitude driving waveform, for example, FIG. 40 may be exemplified. First, after a voltage higher than $V_F$ is applied, a voltage sustaining a predetermined voltage is applied, and the piezoelectric element is allowed to stand by in a state passing through $V_F$, that is, a region of (i) of FIG. 25. The standby voltage $V_m$ is the start point in FIG. 40. In FIG. 40, the start point is set with a value higher than $V_F$. Next, by increasing the voltage, a contracting process $a_3$ is performed. Although the liquid droplets are ejected by the contracting process $a_3$, since the displacement amount at this time is linearly changed according to the change in voltage, it is possible to generate a small amplitude by decreasing the applied voltage. Next, a holding process $b_3$ is performed, and after that, by decreasing the voltage, an expanding process $c_3$ is performed. After that, the piezoelectric element is allowed to return to a standby state.

Figure 41:
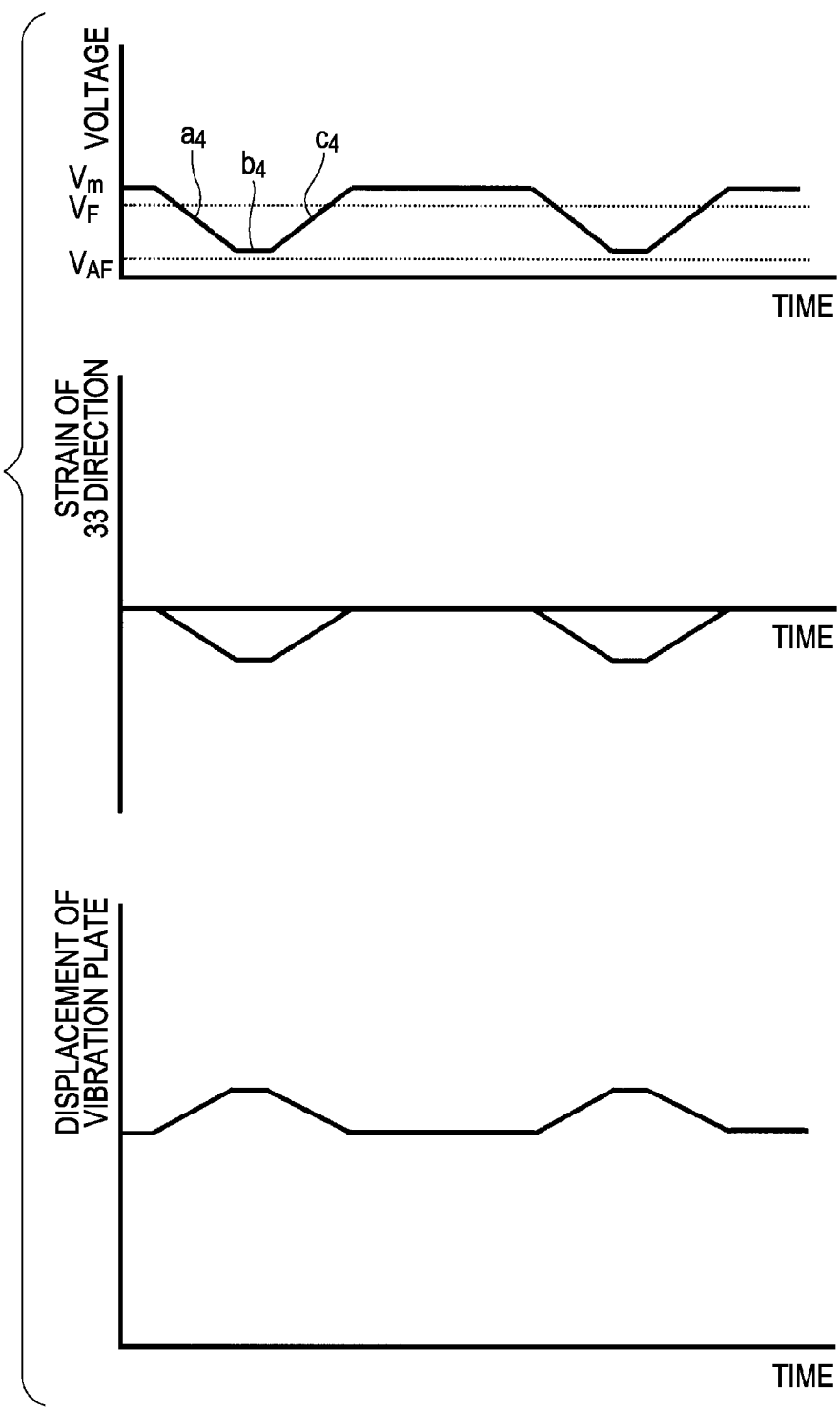
FIG. 41 is a diagram illustrating a driving waveform having a small amplitude.

In addition, as another example of the driving waveform generating a small amplitude, FIG. 41 may be exemplified. First, after a voltage higher than $V_F$ is applied, a voltage sustaining a predetermined voltage is applied, and the piezoelectric element is allowed to stand by in a state passing through $V_F$, that is, in a region of (i) of FIG. 25. The standby voltage $V_m$ is the start point in FIG. 41. In FIG. 41, the start point is set with a value higher than $V_F$. Next, by decreasing the voltage within a range from the start point to $V_{AF}$, an expanding process $a_4$ is performed. A holding process $b_4$ is performed, and after that, by increasing the voltage up to the standby state, a contracting process $c_4$ is performed. Although the liquid droplets are ejected by the contracting process $c_4$, since the displacement amount at this time is linearly changed according to the change in voltage, it is possible to generate a small amplitude by decreasing the applied voltage.

In addition, as illustrated in FIGS. 40 and 41, if the start point is set with a value higher than $V_F$, the voltage may be increased or decreased from the start point. Therefore, by forming a driving waveform as a combination thereof, it is possible to more accurately perform control of the displacement amount, that is, the sizes of the ejected liquid droplets.

On the other hand, if the piezoelectric element is driven between the anti-ferroelectric phase regions, that is, the region where the large strain occurs in the narrow voltage range by the electric field induced phase transition, it is possible to generate a large amplitude. In other words, a driving signal which allows the voltage to be applied to the piezoelectric layer, allows the voltage which passes through $V_F$ and of which the absolute value is higher than $V_{AF}$ to be set as a start point, and allows the voltage to be changed up to a voltage of which the absolute value is lower than $V_{AF}$, or a driving signal which allows the voltage to be applied to the piezoelectric layer, allows the voltage which does not pass through $V_F$ and of which the absolute value is lower than $V_F$ to be set as a start point, and allows the voltage to be changed up to a voltage of which the absolute value is higher than $V_F$ is supplied to the piezoelectric element, so that it is possible to generate a large amplitude.

Figure 42:
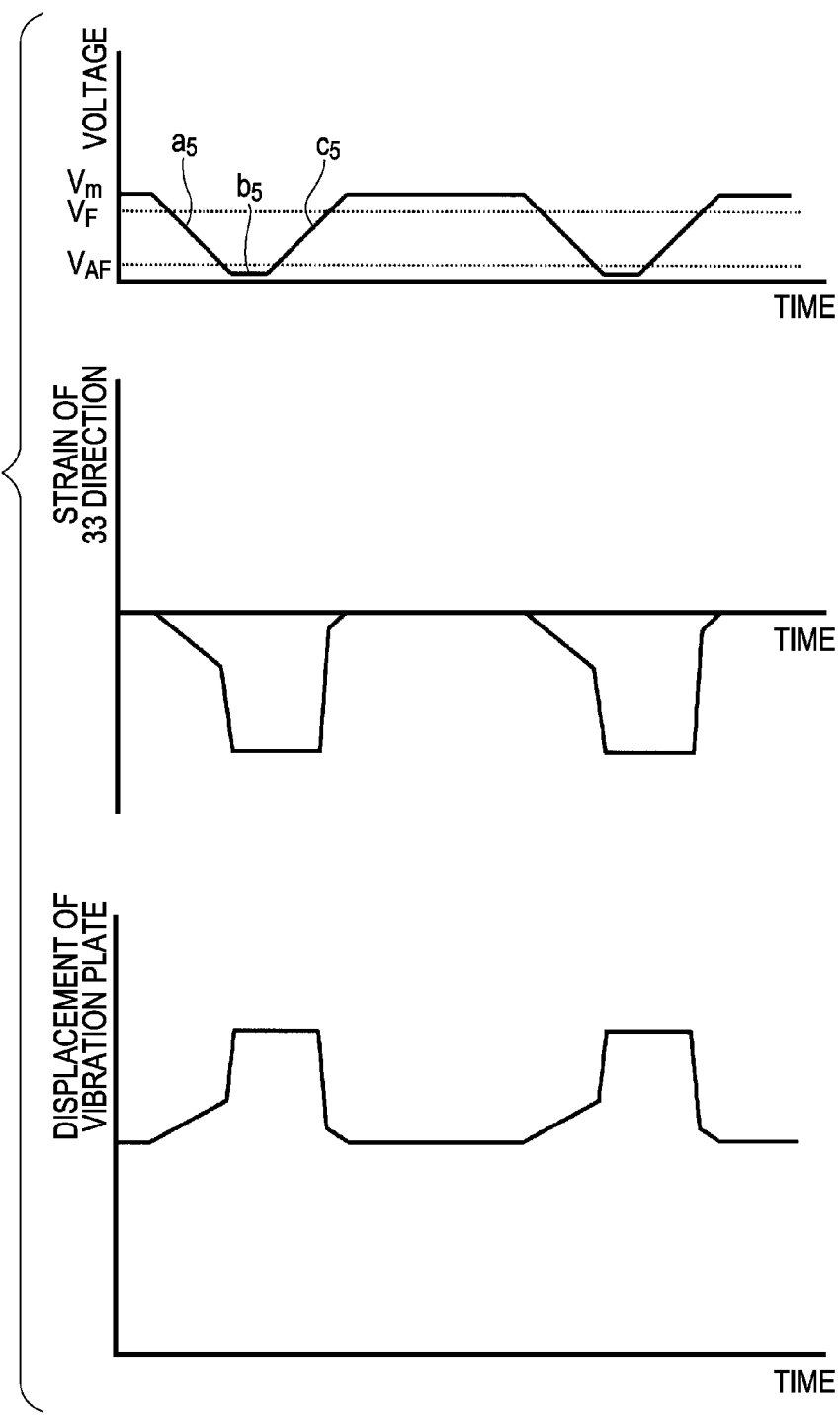
FIG. 42 is a diagram illustrating a driving waveform having a large amplitude.

As a detailed example of a large amplitude driving waveform, for example, FIG. 42 may be exemplified. First, after a voltage higher than $V_F$ is applied, a voltage sustaining a predetermined voltage is applied, and the piezoelectric element is allowed to stand by in a state passing through $V_F$, that is, a region of (i) of FIG. 25. The standby voltage $V_m$ is the start point in FIG. 42. In FIG. 42, the start point is set with a value higher than $V_F$. Next, by decreasing the voltage from the start point down to a value lower than $V_{AF}$, an expanding process $a_5$ is performed. A holding process $b_5$ is performed, and after that, by increasing the voltage up to the standby state, a contracting process $c_5$ is performed. Although the liquid droplets are ejected by the contracting process $c_5$, the strain amount may be increased due to the electric field induced phase transition as the anti-ferroelectric material at this time. Namely, it is possible to generate a large amplitude.

In addition, in FIG. 42, the driving signal of driving in the region interposed between the voltages $V_{AF}$ is described. However, a large amplitude may be generated by performing the driving in the region interposed between the voltages $V_F$. More specifically, by setting the voltage which does not pass through $V_F$ and of which the absolute value is lower than $V_F$ as a start point and increasing the voltage from the start point up to the voltage of which the absolution value is higher than $V_F$, a contracting process is performed. Although the liquid droplets are ejected by the contracting process, the strain amount may be increased due to the electric field induced phase transition as the anti-ferroelectric material at this time.

Namely, it is possible to generate a large amplitude. Next, a holding process is performed, and after that, by decreasing the voltage, an expanding process is performed. After that, the piezoelectric element may be allowed to return to a standby state.

Figure 43:
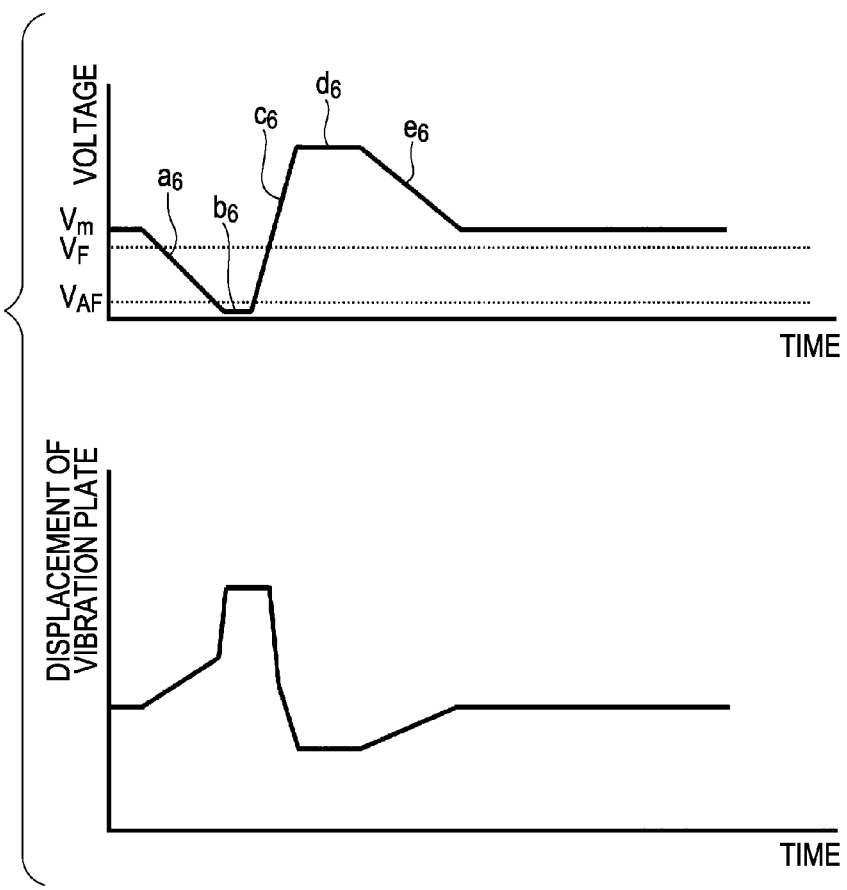
FIG. 43 is a diagram illustrating a driving waveform having a combination of a small amplitude and a large amplitude.

In addition, amplitudes having various sizes may be generated by combining the driving waveform generating a small amplitude and the driving waveform generating a large amplitude. As a detailed example, FIGS. 43 and 44 may be exemplified. In FIG. 43, first, after a voltage higher than $V_F$ is applied, a voltage sustaining a predetermined voltage is applied, and the piezoelectric element is allowed to stand by in a state passing through $V_F$, that is, a region of (i) of FIG. 25. The standby voltage $V_m$ is the start point in FIG. 43. In FIG. 43, the start point is set with a value higher than $V_F$. Next, by decreasing the voltage from the start point down to a value lower than $V_{AF}$, an expanding process $a_6$ is performed. A holding process $b_6$ is performed, and after that, by increasing the voltage up to a value higher than $V_F$, a contracting process $c_6$ is performed. Although the liquid droplets are ejected by the contracting process $c_6$, the contraction is further performed by the contracting process $a_3$ of FIG. 40 as well as by the contracting process $c_5$ of FIG. 42 which generates a large amplitude, it is possible to generate much larger amplitude. Next, a holding process $d_6$ is performed, and after that, by decreasing the voltage, an expanding process $e_6$ is performed. After that, the piezoelectric element is allowed to return to a standby state.

Figure 44:
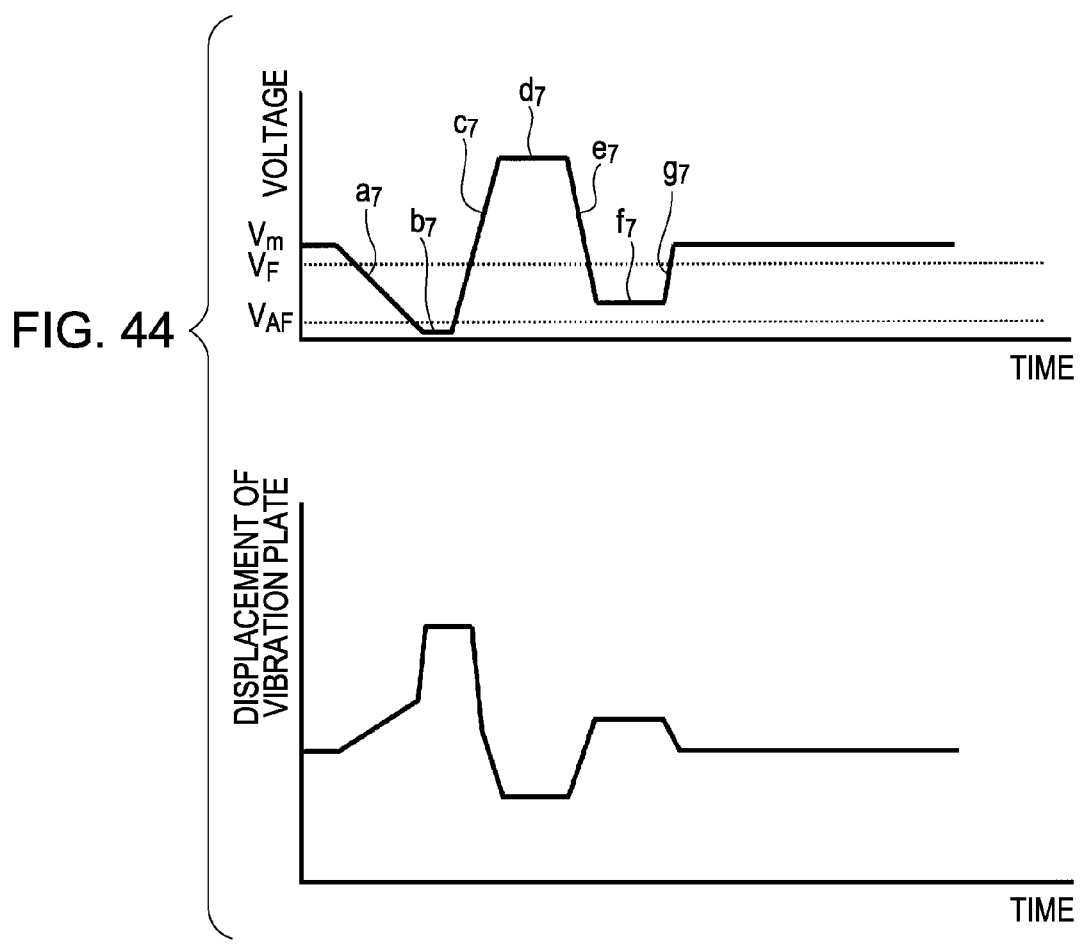
FIG. 44 is a diagram illustrating a driving waveform having a combination of a small amplitude and a large amplitude.

In addition, in FIG. 44, first, after a voltage higher than $V_F$ is applied, a voltage sustaining a predetermined voltage is applied, and the piezoelectric element is allowed to stand by in a state passing through $V_F$, that is, a region of (i) of FIG. 25. The standby voltage $V_m$ is the start point in FIG. 44. In FIG. 44, the start point is set with a value higher than $V_F$. Next, by decreasing the voltage from the start point down to a value lower than $V_{AF}$, an expanding process $a_7$ is performed. A holding process $b_7$ is performed, and after that, by increasing the voltage up to a value higher than $V_F$, a contracting process $c_7$ is performed. Although the liquid droplets are ejected by the contracting process $c_7$, the contraction is further performed by the contracting process $a_3$ of FIG. 40 as well as by the contracting process $c_5$ of FIG. 42 which generates a large amplitude, it is possible to generate much larger amplitude. Next, a holding process $d_7$ is performed, and after that, by decreasing the voltage down to a value higher than $V_{AF}$, an expanding process $e_7$ is performed. In addition, a holding process $f_7$ is performed, and after that, by increasing the voltage, a contracting process $g_7$ is performed. After that, the piezoelectric element is allowed to return to a standby state. Since the vibration may be absorbed by the holding process $f_7$ and the contracting process $g_7$, the piezoelectric element may return to the standby state rapidly.

In addition, by selectively supplying the driving signal for a small amplitude vibration and the driving signal for a large amplitude vibration to the piezoelectric element by the driving signal control unit of the driving unit, a desired vibration may be generated.

OTHER EMBODIMENTS

Hereinbefore, the embodiments of the invention are described, but the basic configuration of the invention is not limited to the aforementioned configuration. For example, in the aforementioned embodiment, an $ABO_3$ type composite oxide containing only the Bi, La, Fe, and Mn as metal elements is described. However, the electric field induced phase transition may be shown by the $ABO_3$ type composite oxide containing Bi, La, Fe, and M, and the piezoelectric characteristics may be improved by adding other metals.

In addition, in the aforementioned embodiment, the single-crystalline silicon substrate is exemplified as a passage-forming substrate 10, but the invention is not particularly limited thereto. For example, an SOI substrate or a material such as a glass may be used.

In addition, in the aforementioned embodiment, the piezoelectric elements 300 obtained by sequentially laminating the first electrode 60, the piezoelectric layer 70, and the second electrode 80 on a substrate (passage-forming substrate 10) is exemplified, but the invention is not particularly limited thereto. For example, the invention may be adapted to a longitudinal vibration type piezoelectric element where piezoelectric material and electrode-forming material are alternately laminated and extended in the axis direction.

In addition, in the aforementioned first embodiment, the description is made with reference to the ink jet type recording head exemplified as a liquid ejecting head. The invention relates to a wide whole range of liquid ejecting heads, so that the invention may be adapted to a liquid ejecting head ejecting liquid other than ink. As the other liquid ejecting heads, there are, for example, various types of recording heads used for an image recording apparatus such as a printer, a coloring material ejecting head used for manufacturing a color filter or the like of a liquid crystal display or the like, an electrode material ejecting head used for forming electrodes of an organic EL display, an FED (Field Emission Display), or the like, a bio-organic material ejecting head used for a bio-chip, or the like.

In addition, the invention is not limited to a piezoelectric element which is mounted on a liquid ejecting head, representatively, an ink jet type recording head, but it may be adapted to a piezoelectric element such as an ultrasonic device such as an ultrasonic oscillator, an ultrasonic motor, a pressure sensor, a ferroelectric material memory, or the like.

What is claimed is:

1. A liquid ejecting apparatus comprising:
a pressure generation chamber which communicates with a nozzle orifice;
a piezoelectric element which includes a piezoelectric layer and a plurality of electrodes;
a driving unit which supplies a driving signal to the piezoelectric element to change a pressure of liquid in the pressure generation chamber, so that liquid droplets are ejected from the nozzle orifice,
wherein the piezoelectric layer includes an anti-ferroelectric material and shows electric field induced phase transition, and
wherein, when among voltages at which the piezoelectric layer shows the electric field induced phase transition, a voltage having a higher absolute value is defined as $V_F$ and a voltage having a lower absolute value is defined as $V_{AF}$,
wherein the driving unit supplies to the piezoelectric element the driving signal which:
allows the voltage to be applied to the piezoelectric layer,
allows a standby voltage Vm that passes through $V_F$ and of which the absolute value is equal to or higher than $V_{AF}$ to be set as a start point, and
allows the voltage to be changed within a range where the absolute value of the voltage is equal to or higher than $V_{AF}$.

2. A liquid ejecting apparatus comprising:
a pressure generation chamber which communicates with a nozzle orifice;
a piezoelectric element which includes a piezoelectric layer and a plurality of electrodes; and
a driving unit which supplies a driving signal to the piezoelectric element to change a pressure of liquid in the pressure generation chamber, so that liquid droplets are ejected from the nozzle orifice,
wherein the piezoelectric layer includes an anti-ferroelectric material and shows electric field induced phase transition, and
wherein, when among voltages at which the piezoelectric layer shows the electric field induced phase transition, a voltage having a higher absolute value is defined as $V_F$ and a voltage having a lower absolute value is defined as $V_{AF}$,
wherein the driving unit supplies to the piezoelectric element:
the driving signal which:
allows a voltage to be applied to the piezoelectric layer,
allows a standby voltage Vm which passes through $V_F$ and of which the absolute value is higher than $V_{AF}$ to be set as a start point, and
allows the voltage to be changed to a voltage of which the absolute value is lower than $V_{AF}$.

3. A liquid ejecting apparatus comprising:
a pressure generation chamber which communicates with a nozzle orifice;
a piezoelectric element which includes a piezoelectric layer and a plurality of electrodes;
a driving unit which supplies a driving signal to the piezoelectric element to change a pressure of liquid in the pressure generation chamber, so that liquid droplets are ejected from the nozzle orifice,
wherein the piezoelectric layer includes an anti-ferroelectric material and shows electric field induced phase transition, and
wherein, when among voltages at which the piezoelectric layer shows the electric field induced phase transition, a voltage having a higher absolute value is defined as $V_F$ and a voltage having a lower absolute value is defined as $V_{AF}$,
wherein the driving unit supplies to the piezoelectric element:
the driving signal which:
allows the voltage to be applied to the piezoelectric layer,
allows a standby voltage Vm which passes through $V_F$ and of which the absolute value is equal to or higher than $V_{AF}$ to be set as a start point, and
allows the voltage to be changed within a range where the absolute value is equal to or higher than $V_{AF}$; and
the driving signal which:
allows the standby voltage Vm to be applied to the piezoelectric layer,
allows the voltage which passes through $V_F$ and of which the absolute value is equal to or higher than $V_{AF}$ to be set as the start point and
allows the voltage to be changed down to a voltage of which the absolute value is lower than $V_{AF}$.

4. The liquid ejecting apparatus according to claim 3, further comprising a driving signal control unit which selectively supplies to the piezoelectric element:
a driving voltage which:
allows the voltage to be applied to the piezoelectric layer, allows the standby voltage Vm which passes through $V_F$ and of which the absolute value is equal to or higher than $V_{AF}$ to be set as the start point, and allows the voltage to be changed within a range where the absolute value is equal to or higher than $V_{AF}$, and a driving voltage which:

allows the voltage to be applied to the piezoelectric layer, allows the standby voltage Vm which passes through $V_F$ and of which the absolute value is equal to or higher than $V_{AF}$ to be set as the start point, and allows the voltage to be changed down to a voltage of which the absolute value is lower than $V_{AF}$.

5. The liquid ejecting apparatus according to claim 1, wherein the piezoelectric material is a perovskite-type composite oxide containing Bi, La, Fe, and Mn and shows electric field induced phase transition.

6. The liquid ejecting apparatus according to claim 1, wherein the piezoelectric material is made of a composite oxide expressed by the following general formula (I):

$$(Bi_{1-x},La_x)(Fe_{1-y},Mn_y)O_3 \qquad (1)$$

where x and y are ($0.21 \leq x \leq 0.38$, $0.01 \leq y \leq 0.09$).

\* \* \* \* \*